United States Patent
Magerlein et al.

(10) Patent No.: US 7,855,442 B2
(45) Date of Patent: Dec. 21, 2010

(54) SILICON BASED PACKAGE

(75) Inventors: John H. Magerlein, Yorktown Heights, NY (US); Chirag S. Patel, Peekskill, NY (US); Edmund J. Sprogis, Underhill, VT (US); Herbert I. Stoller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 11/650,883

(22) Filed: Jan. 8, 2007

(65) Prior Publication Data

US 2007/0111385 A1    May 17, 2007

Related U.S. Application Data

(63) Continuation of application No. 10/771,817, filed on Jun. 16, 2004, now Pat. No. 7,189,595, which is a continuation-in-part of application No. 09/870,531, filed on May 31, 2001, now Pat. No. 6,878,608.

(51) Int. Cl.
*H01L 23/02* (2006.01)

(52) U.S. Cl. .................. 257/686; 257/698; 257/738; 257/780; 257/E23.011

(58) Field of Classification Search .............. 257/686, 257/E23.011, 698, 738, 780, 778; 438/455, 438/459, 613, 639, 640, 667
See application file for complete search history.

(56) References Cited

U.S. PATENT DOCUMENTS 4,074,342 A * 2/1978 Honn et al. ............. 361/779
5,627,406 A * 5/1997 Pace ....................... 257/700
5,757,081 A * 5/1998 Chang et al. ............ 257/778
6,287,940 B1 * 9/2001 Cole et al. ............... 438/455
6,599,778 B2 * 7/2003 Pogge et al. ............. 438/118
6,617,681 B1 * 9/2003 Bohr ....................... 257/700
6,809,008 B1 * 10/2004 Holm et al. .............. 438/455
6,838,362 B2 * 1/2005 Mastromatteo et al. ..... 438/524
6,882,045 B2 * 4/2005 Massingill et al. ........ 257/724
6,975,030 B1 * 12/2005 Akram et al. ............ 257/737
7,087,996 B2 * 8/2006 Danielson et al. ........ 257/737

* cited by examiner

*Primary Examiner*—Mary Wilczewski
*Assistant Examiner*—Toniae M Thomas
(74) *Attorney, Agent, or Firm*—John A. Jordan

(57) ABSTRACT

A Silicon Based Package (SBP) is formed starting with a thick wafer, which serves as the base for the SBP, composed of silicon which has a first surface and a reverse surface which are planar. Then form an interconnection structure including metal capture structures in contact with the first surface and multilayer conductor patterns over the first surface. Form a temporary bond between the SBP and a wafer holder, with the wafer holder being a rigid structure. Thin the reverse side of the wafer to a desired thickness to form an Ultra Thin Silicon Wafer (UTSW) for the SBP. Form via holes with tapered or vertical sidewalls, which extend through the UTSW to reach the metal capture structures. Then form metal pads in the via holes which extend through the UTSW, making electrical contact to the metal capture structures. Then bond the metal pads in the via holes to pads of a carrier.

7 Claims, 24 Drawing Sheets

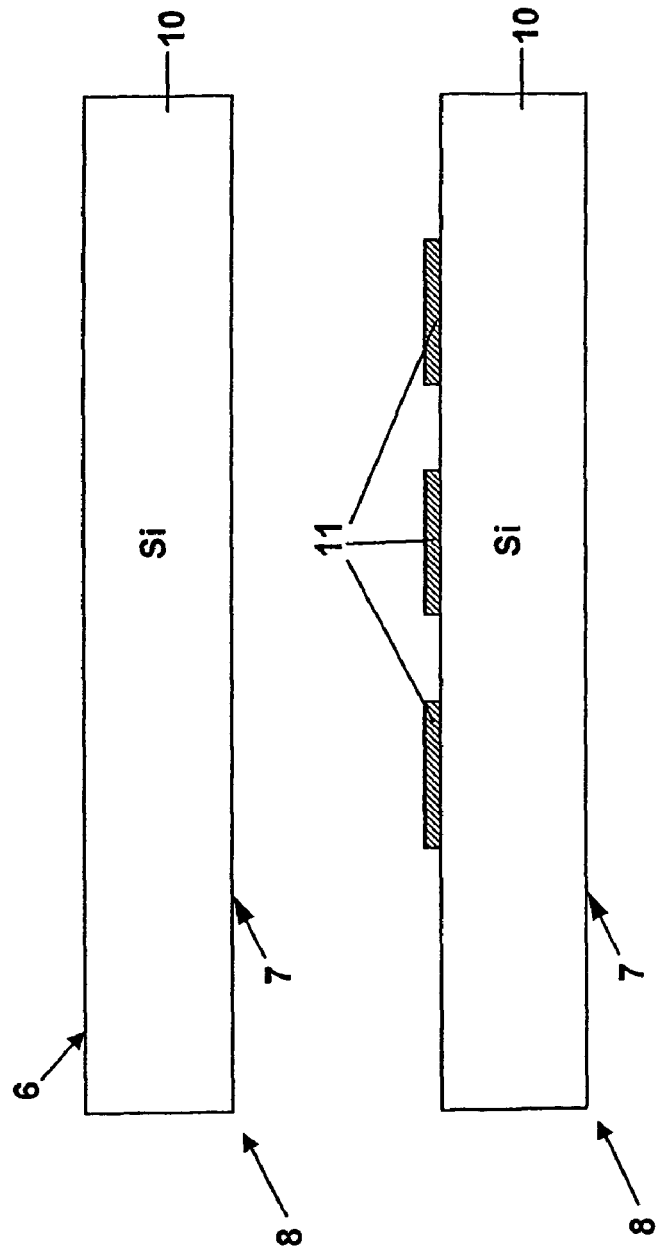

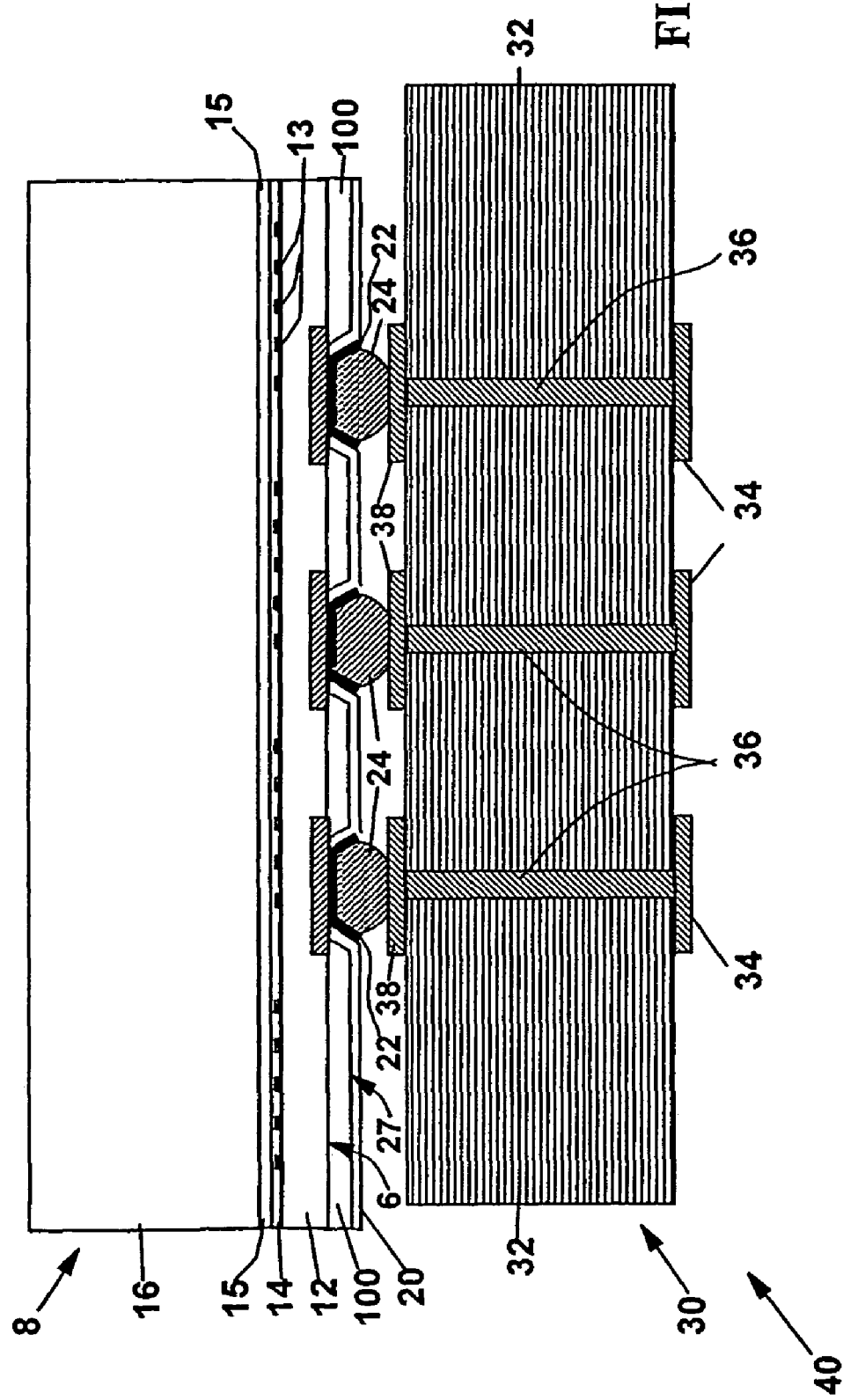

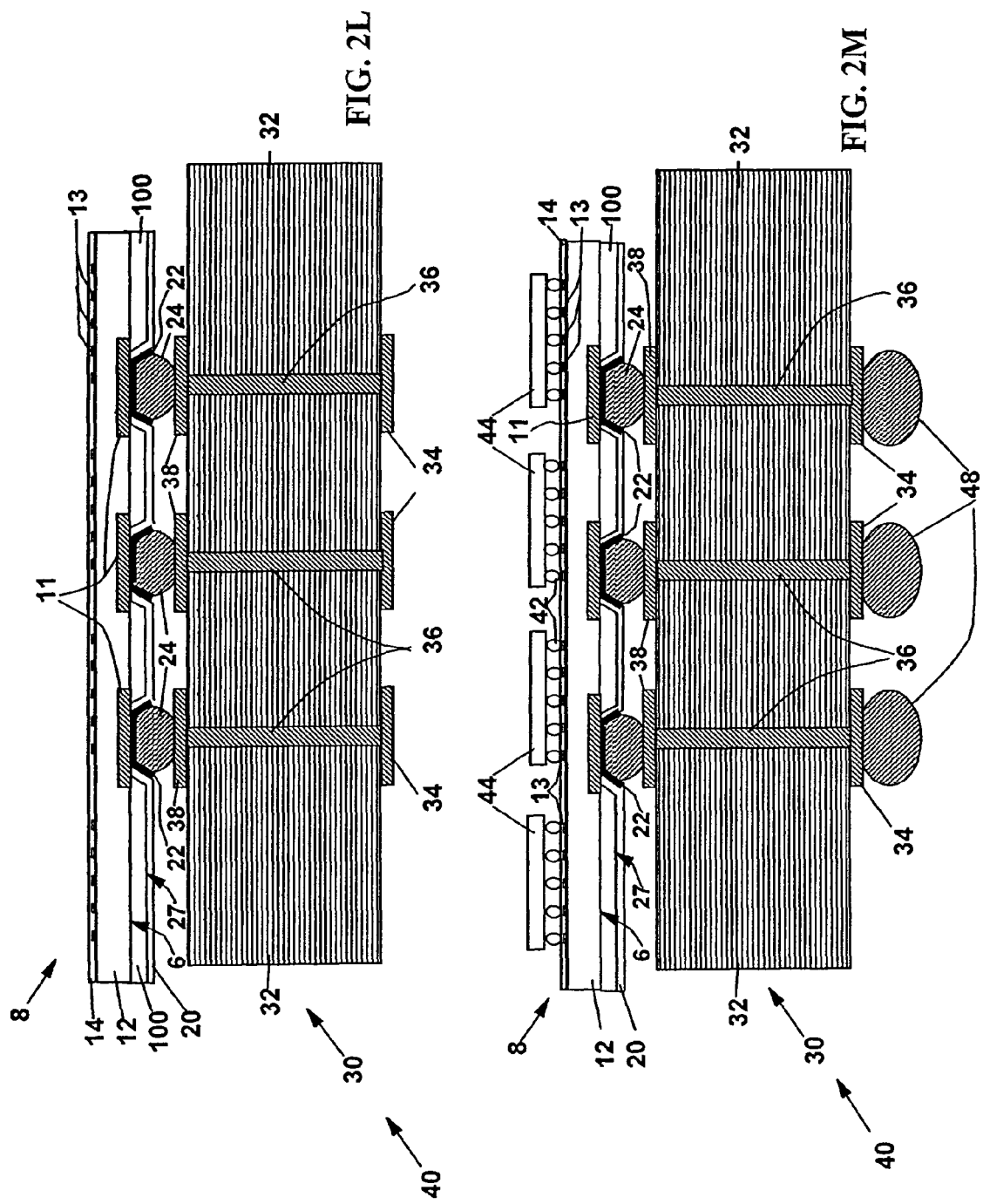

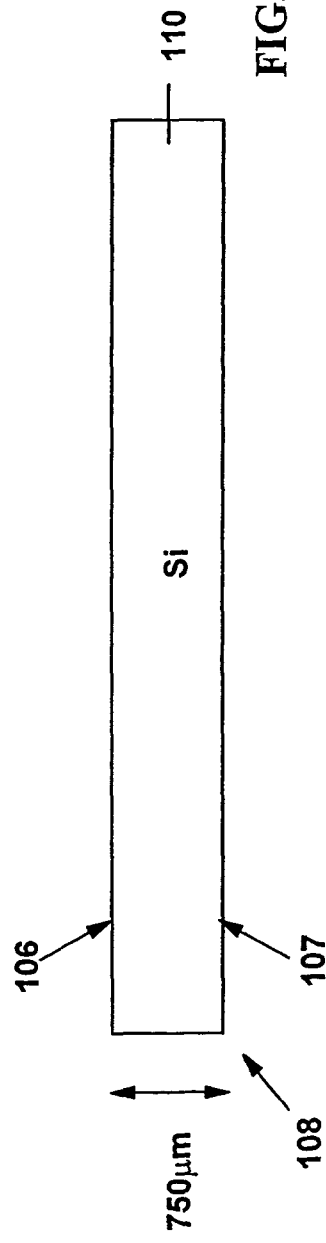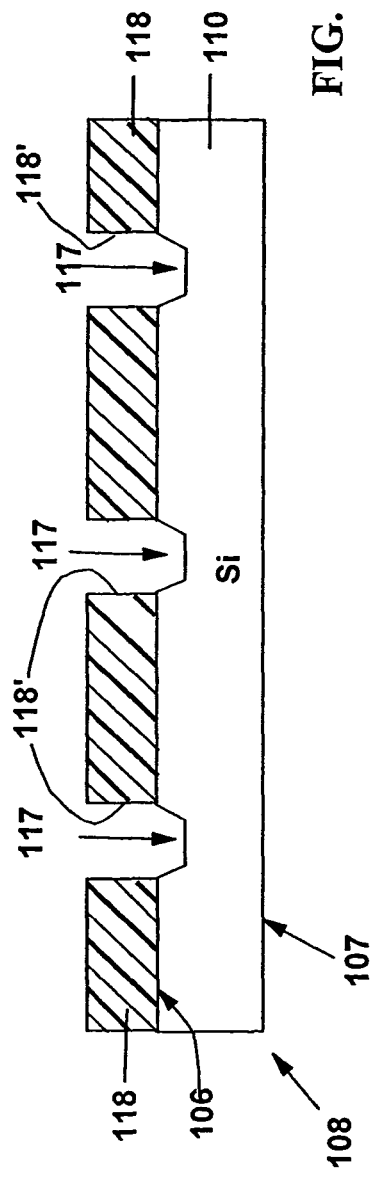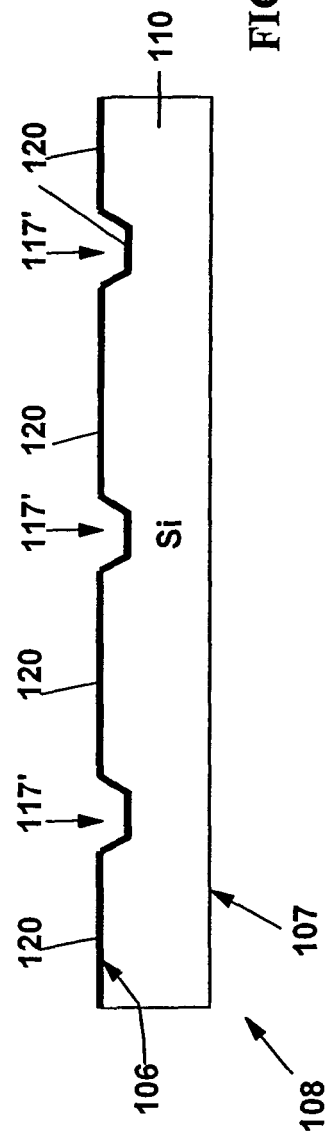

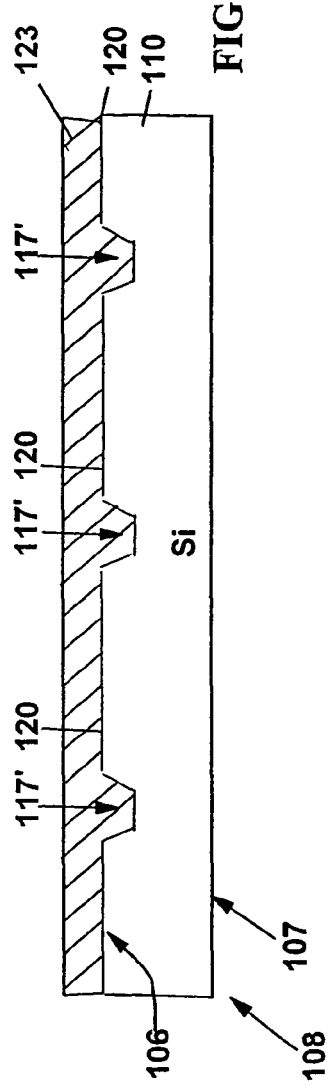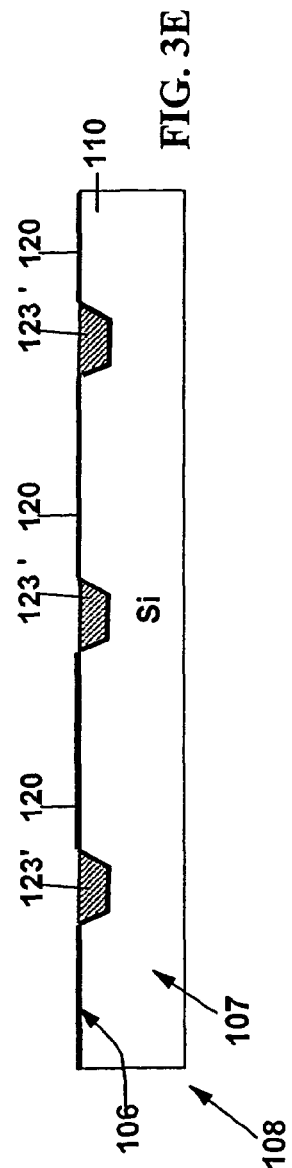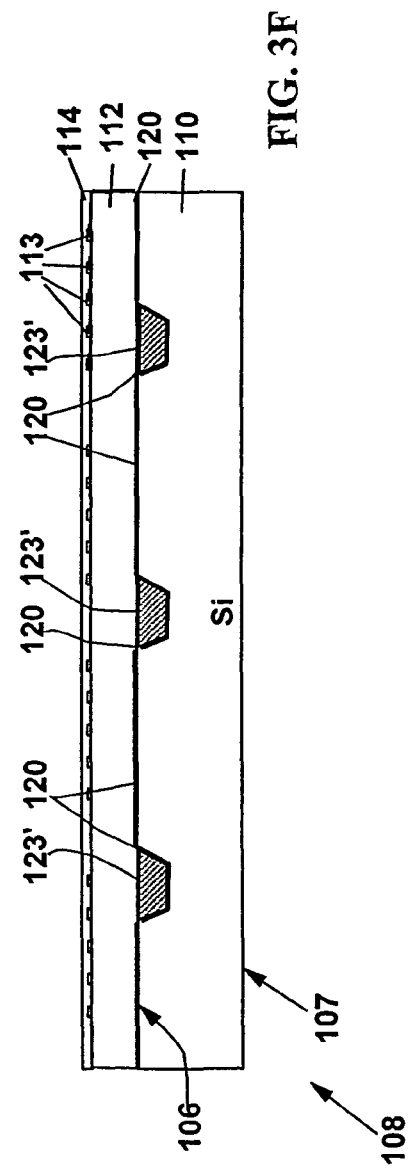

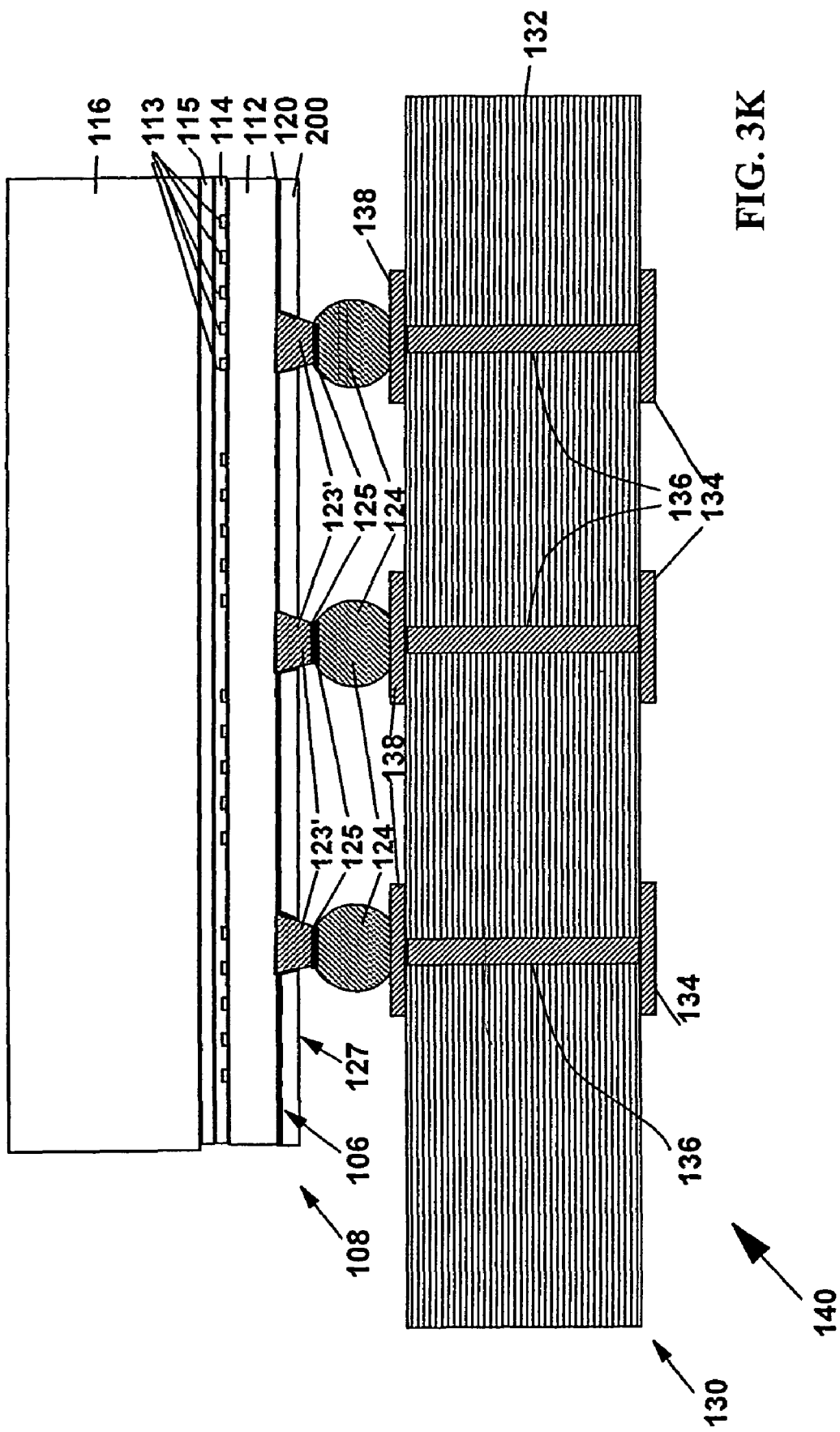

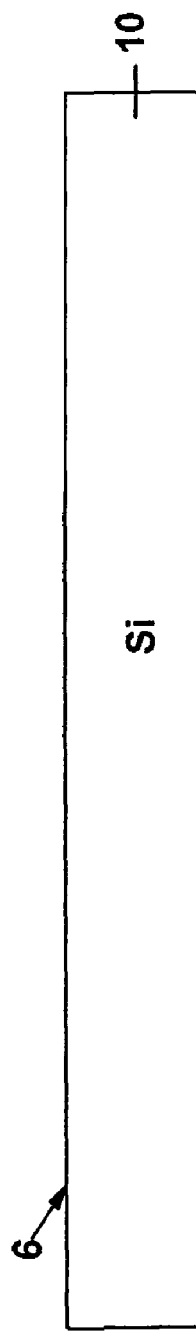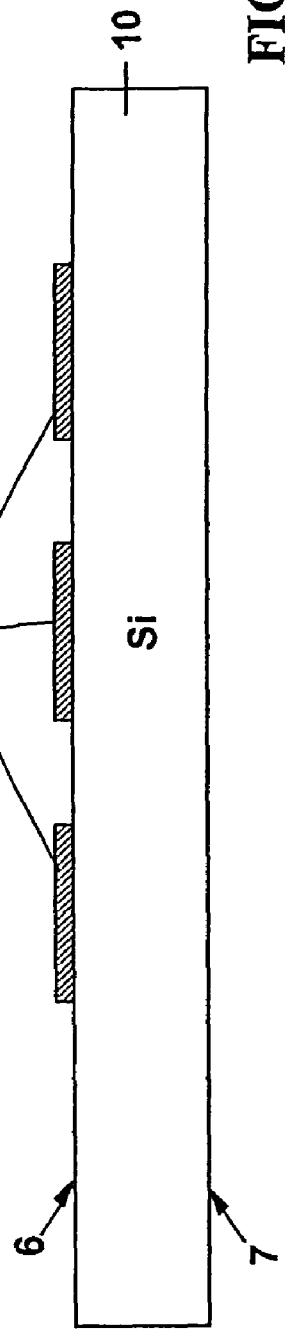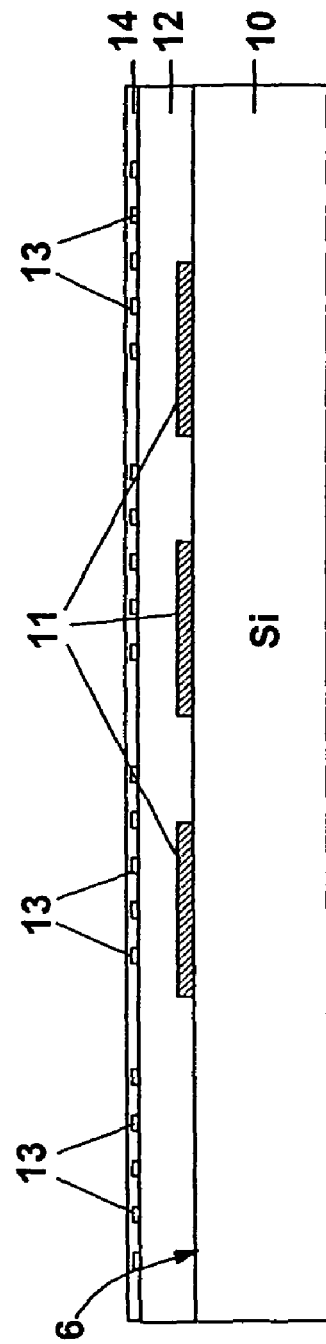

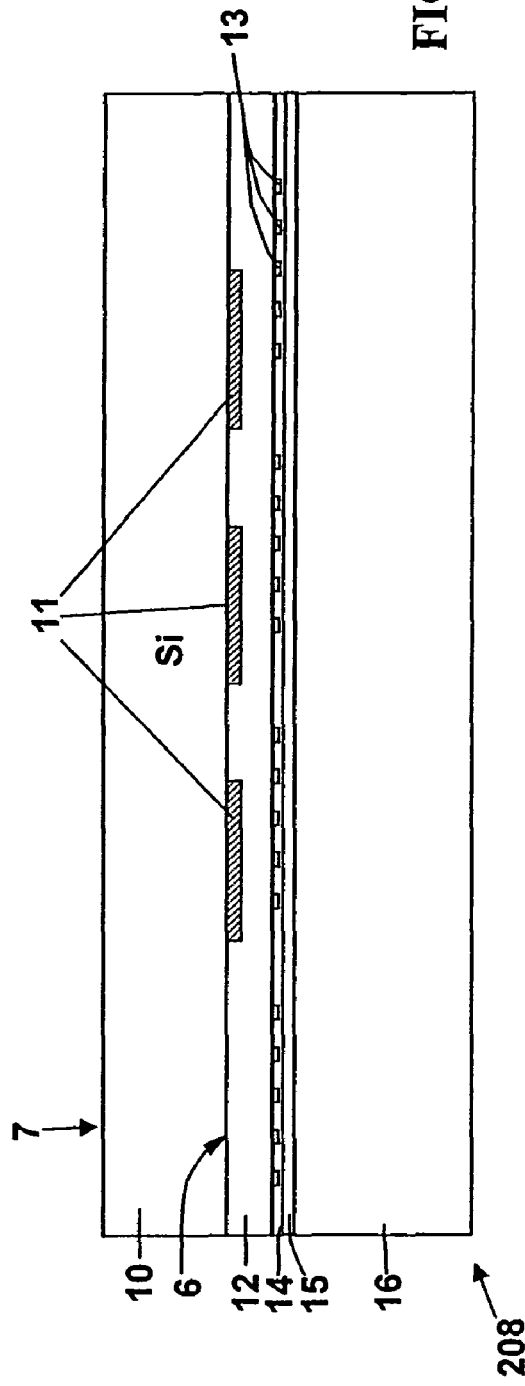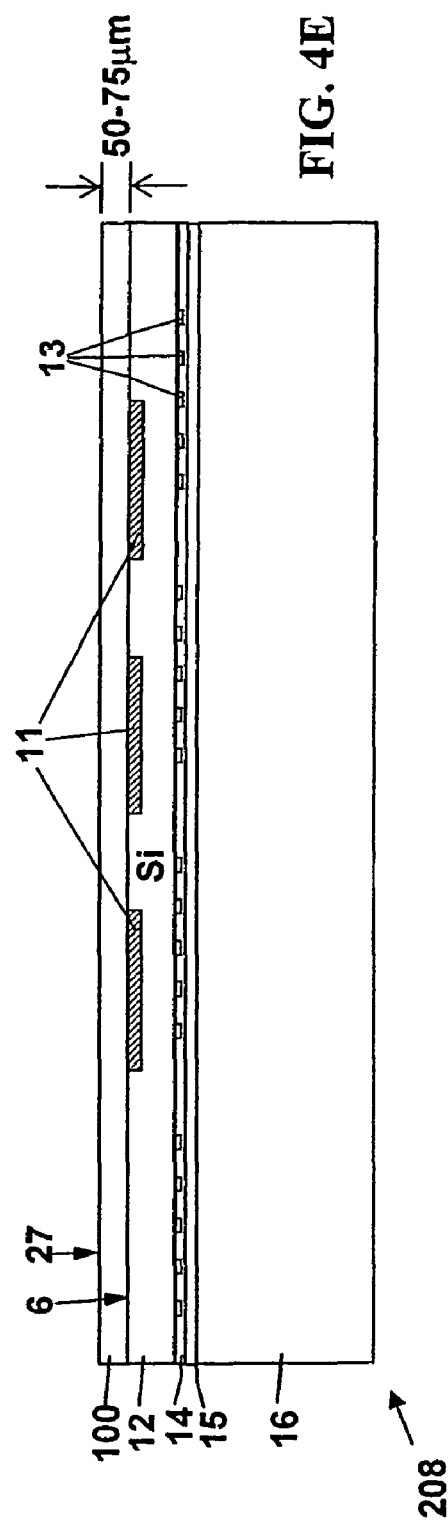

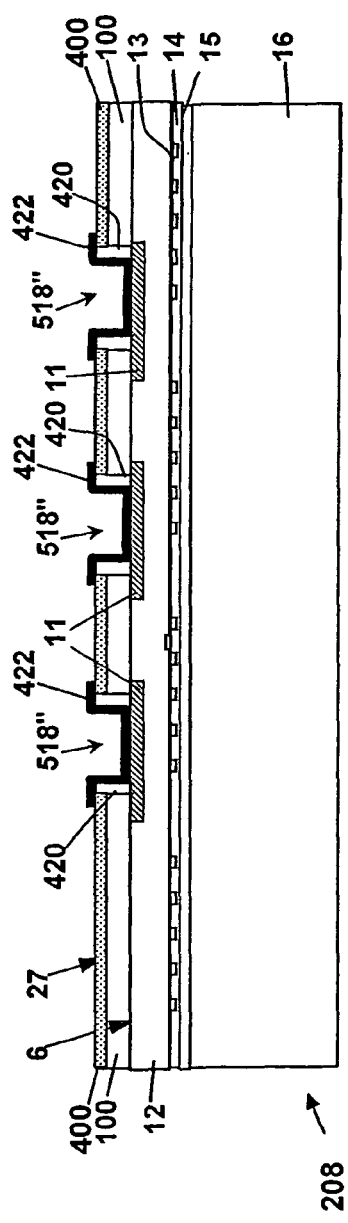

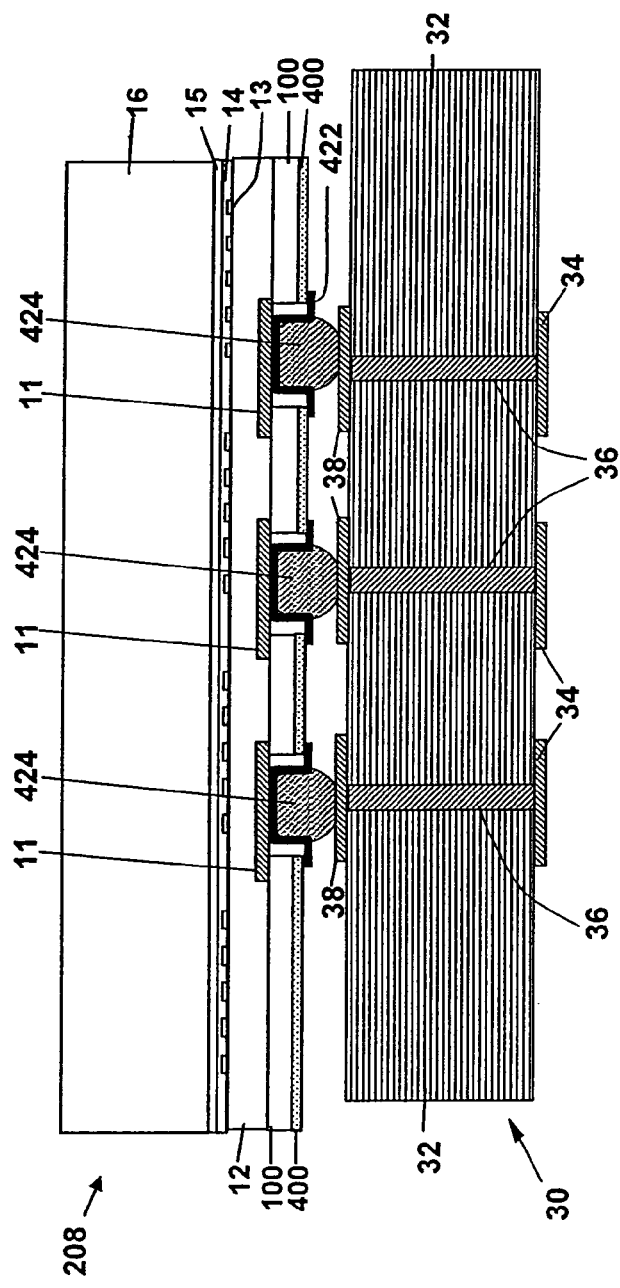
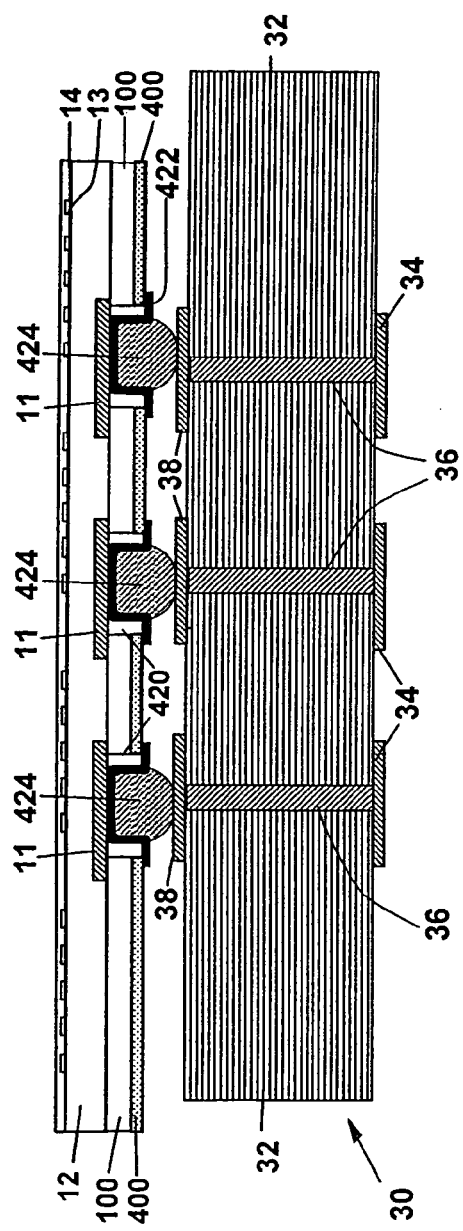
FIG. 4O
FIG. 4P

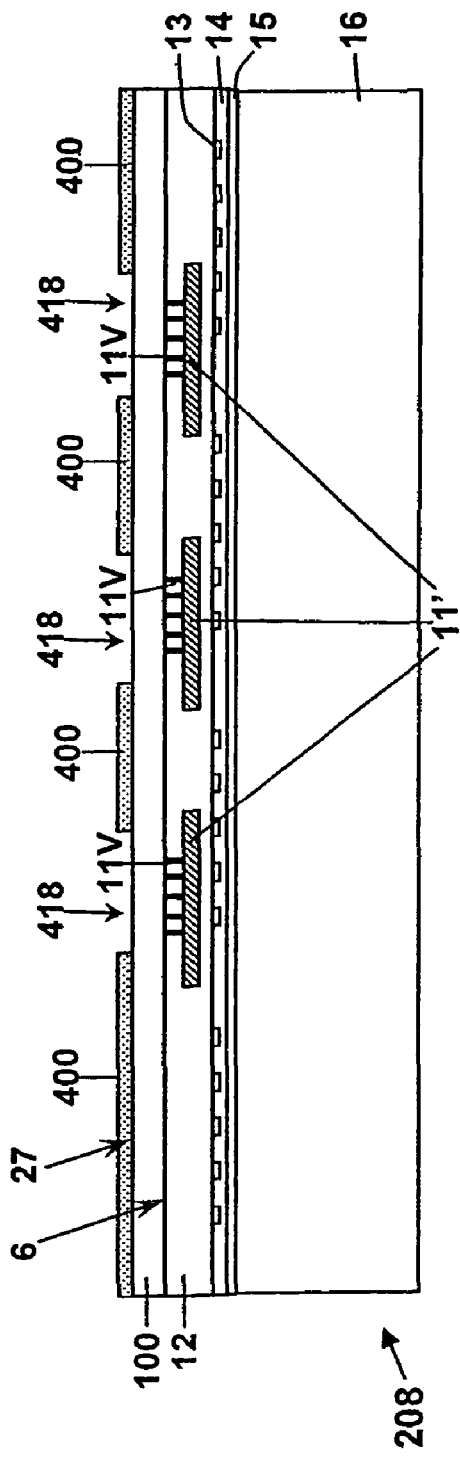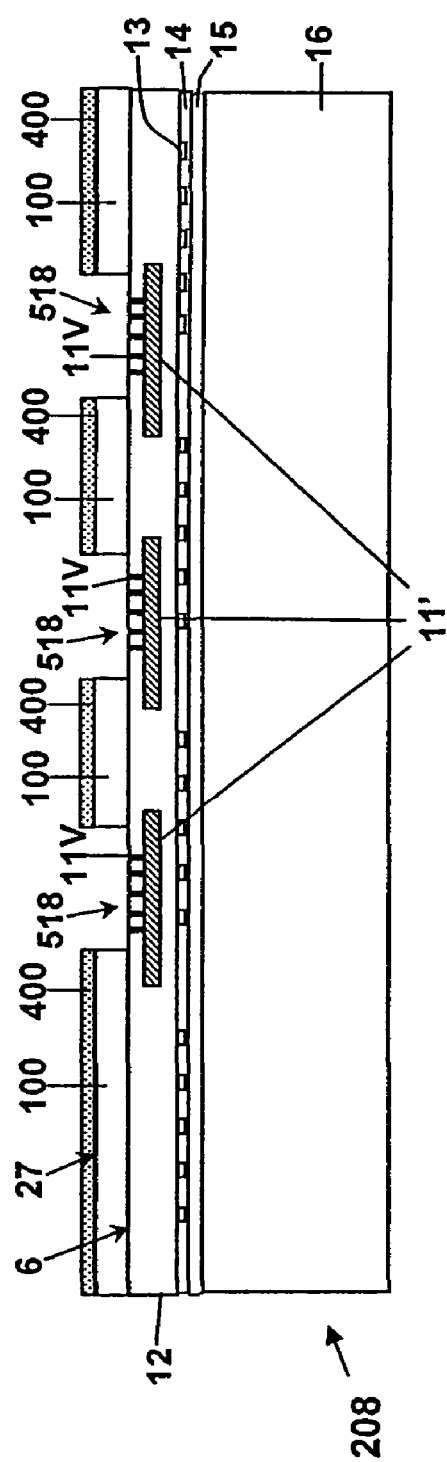

US 7,855,442 B2

SILICON BASED PACKAGE

The present application is a continuation application of a continuation-in-part U.S. patent application Ser. No. 10/771,817, filed Jun. 16, 2004 now U.S. Pat. No. 7,189,595, allowed Nov. 16, 2006, which continuation-in-part application is based on application Ser. No. 09/870,531, filed May 31, 2001, and issued on Apr. 12, 2005 as U.S. Pat. No. 6,878,608 B2.

BACKGROUND OF THE INVENTION

1. Field of the Invention

This invention relates to semiconductor devices and more particularly to a method of manufacturing semiconductor packaging.

2. Description of Related Art

U.S. Pat. No. 5,497,545 of Watanabe et al. for "Method of Making Electrical Connections in the Manufacture of Wiring Sheet Assemblies" describes a multilayer conductor stack formed on a polyimide or ceramic carrier having first and second conductor separated by an insulator sheet are electrically interconnected by a stud inserted through a hole formed in the second conductor and the insulator sheet. Wire bonding and stamping secure the stud to the conductors, thereby forming an electrical connection.

U.S. Pat. No. 5,654,590 of Kuramochi for "Multichip-Module Having an HDI and a Temporary Supporting Substrate" starts with a bonding layer composed of a material such as silicon, aluminum or epoxy resin formed over a temporary supporting base with a temporary supporting layer composed of a material such as $SiO_2$ or various glasses. Then an insulating layer is formed over the bonding layer with throughholes. Next a copper interconnection layer is formed and patterned lithographically. Several alternate insulating layers and interconnection layers with coaxial throughholes are formed. The interconnection layers are also connected by vias. The resulting chip supporting substrate is then separated from the temporary supporting base by etching away the temporary supporting layer of $SiO_2$ or glass with an etchant such as HF, $NH_4F$ or a mixture of $NH_3$ F and $H_3PO_4$. Butyl acetate and acetone are suggested to etch away the epoxy resin.

U.S. Pat. No. 5,965,933 of Young et al. for "Semiconductor Packaging Apparatus" starts the process of manufacture with a thick silicon wafer in which microelectronic devices are to be formed in a device area. Contact cavities have been etched in the top surface of the thick wafer in a pattern surrounding the device area. The contact cavities are filled with via pads composed of refractory metal such as titanium, titanium tungsten or a silicide. Then a semiconductor device is formed in the device area and interconnnects are formed along with an intermediate dielectric layer which is formed above the entire thick silicon wafer including the device, the interconnects and the vias. A cover wafer formed of a semiconductor such as silicon is formed over the intermediate dielectric layer and bonded to the thick silicon wafer. Then the thick silicon wafer is thinned by removing material from the bottom surface thereof until the bottom surfaces of the vias are exposed. Conventional bump contacts are formed on the bottom surfaces of the vias.

Alternatively, there is the possibility of forming the vias in the cover wafer instead of the thick silicon wafer by preforming vias in holes in the cover wafer, followed by bonding the cover wafer over the intermediate dielectric layer, the interconnect and the thick silicon wafer. Then the cover wafer is thinned to open the via holes, etc. Next the via holes are filled with metal and bump contacts are formed over the metal vias.

U.S. Pat. No. 6,184,060 of Siniaguine for "Integrated Circuits and Methods for Their Fabrication" describes formation of vias and contact pads on the back side of a silicon semiconductor chip. The vias and contact pads are formed by the process starting with forming tapered vias (openings) in the back of a silicon wafer workpiece with an isotropic plasma etch of the via opening down into the silicon wafer through an aluminum or photoresist mask formed over the silicon. The via openings have a depth at least as large as the final thickness of the wafer after the manufacturing process is completed. After the mask is removed, a thin conformal, glass or BPSG dielectric layer (1-2 µm thick) is formed over the substrate including the vias. Then a thin conformal blanket conductive layer (e.g. 0.8-1.2 µm thick) is formed over the dielectric layer of aluminum, gold or nickel. A planar glass layer is spun onto the surface of the conductive layer to fill the vias to provide a planar top surface of the wafer. The conductive layer may or may not have been patterned before the last step of filling the vias with the planar glass layer.

Other layers to be a part of the device structure are then formed on top of the planarized surface of the workpiece including a dielectric layer and contact pads. Then the back side of the silicon wafer is etched by an atmospheric plasma etch with argon and carbon tetrafluoride in air. When the glass or BPSG dielectric layer becomes exposed, the silicon substrate is preferentially etched relative to the silicon dioxide dielectric layer by at least an order of magnitude difference with the silicon etching far more quickly. Thus, the portions of the lower surface (back side) of the conductive layer formed in the via openings comprise contact pads for the back side of the chip that are exposed by the preferential etching away of the silicon.

U.S. Pat. No. 5,258,235 of Arjavalingam et al. for "Multilayer Thin Film Structure and Parallel Process in Method for Fabricating Same" describes releasing a structure from a substrate by a laser ablation shining a laser beam through the substrate to ablate the polyimide film and the polyimide film releases the structure.

Matsuo et al. "Silicon Interposer Technology for High-density Package" Electronic Components and Technology Conference, IEEE, 4 pages (2000) describes a fabrication process in which through hole 30 µm in diameter and 60 µm deep was etched anisotropically by a "high-speed RIE process" resulting in a hole with nearly vertical sidewalls. After coating the wafer with silicon dioxide, the through hole was filled with Cu by electroplating onto a Cu/TaN seed layer. After many intervening steps, the wafer was thinned until exposing the through plug by BSG. The vertical sidewalls of the through hole may present a problem with regard to the mechanical integrity of the ultimate thin wafer because of stresses generated by the mismatch of the characteristics of the silicon and the copper. Such thin wafers with inherent stresses may be difficult to handle through normal handling during the fabrication of multilevel wiring processes.

One of the problems with using silicon based structures for electronic packaging applications is to be able to provide a highly reliable product by employing an efficient method of forming vias through a membrane thin silicon substrate, i.e. from the bottom surface through the silicon to the top of the silicon where the wiring structure is fabricated. That requires forming the vias without breaking the fragile membrane thin wafer and yet performing the task with a highly competitive manufacturing cost.

See U.S. Pat. No. 6,036,809 of Kelly et al. and U.S. Pat. No. 6,066,562 of Ohshima et al.

SUMMARY OF THE INVENTION

A problem with using silicon based structures for electronic packaging applications is the need for getting vias through the silicon from the bottom surface through the silicon to the top of the silicon where the wiring structure is fabricated. This invention solves the above problem by some or all of the techniques as follows:

a) using a wafer thinning process to create a silicon structure thin enough for reasonable sized vias to be created;
b) forming unique structures comprising metal capture pads or metal capture vias as the first level of metal placed on the silicon surface to prepare for creation of the vias, with the metal capture pads serving as a natural etch stop, allowing creation of the vias without requiring extremely precise etch control or without pre-etching and filling vias by a conventional via filling process;
c) using a sacrificial glass plate as a holder to facilitate handling of UTSW (Ultra Thin Silicon Wafers); and/or
d) minimizing the number of through vias required in the combined silicon/carrier structure, which enables the use of large reliable vias to be utilized.

This invention provides a structure, and a process for creating said structure, for a silicon based electronic package combining an ultra-thin silicon substrate with a suitable carrier such as an MLC (Multi-Layer Ceramic) substrate in such a combination that the through vias needed are minimized.

An advantage of this invention is the ability to support very high wiring density packaging applications with low cost silicon based processing technology.

In accordance with this invention, a Silicon Based Package (SBP) is manufactured starting with a standard silicon wafer. The wafer is then attached to a temporary, transparent, glass wafer holder and a wafer thinning process such as atmospheric plasma etching or a CMP process is used to thin the wafer to a thickness in the range from about 50 µm to about 75 µm from an original thickness of about 750 µm. Then, formation of a single or a multiplicity of wiring structures on each wafer is performed.

In a first aspect of this invention the process steps are performed in the sequence as follows:
1. Start with a standard silicon wafer.
2. Form metal capture structures in the form of metal capture pads on the top wafer surface; or form metal capture pads buried in the BEOL (Back End Of Line) structure with thin diameter, metal capture vias reaching from the wafer surface down to contact the buried metal capture pads.
3. Form a BEOL structure (including multilayer conductor patterns and C4 pads) over the surface top wafer surface including the C4 pads. In the case of the buried metal capture pad, a multi-step process is employed starting with formation of a portion of the BEOL structure followed by forming narrow diameter via holes which are filled with small diameter, metal capture vias. Then the buried metal capture pad is formed followed by completion of the remainder of the BEOL structure.
4. Form a temporary bond of a temporary, transparent, glass wafer holder to the exposed surface of the BEOL structure above the silicon wafer using a releasable adhesive.
5. Thin the silicon wafer to a desired thickness in the range from about 50 µm to about 75 µm to form a UTSW for the SBP. Preferably the step of thinning follows inversion of the silicon wafer so that the BEOL structure and the transparent glass wafer holder, which were originally on top are then on the bottom and the reverse surface (original bottom surface) of the thick silicon wafer is on the top, ready for thinning resulting in a thinned reverse surface.
6. Form a mask on the exposed, thinned, reverse "back" surface of the thinned wafer, and etch via holes through the thinned, reverse "back" of the thinned wafer, with the metal capture pads or metal capture vias serving as etch stops. Alternatively, form a soft mask or a hard mask that is patterned by a soft mask followed by etching of via holes in either case. In the case of the soft mask, to form TSTV holes, use a wet etch to form via holes with tapered sidewalls. In the case of use of a hard mask to form Vertical Sidewall Through Via (VSTV) holes, use a dry etch to form vertical sidewalls.
7. Deposit a blanket silicon oxide liner layer covering the hard mask on the surface of the thinned wafer and covering the surfaces in the VSTV holes. Then remove the portions of the blanket silicon oxide layer at the bottoms of the via holes exposing surfaces of the metal capture pads or metal capture vias. The blanket silicon oxide layer remains on the sidewalls of the VSTV holes protecting the surfaces of the thinned wafer. If a soft mask is used to form a TSTV hole, the blanket silicon oxide layer covering the TSTV is etched to expose the bottoms of the via holes using an oxide etch, such as a wet chemical etch. If a hard mask is used to expose the bottoms of the VSTV holes, it is preferred to use an anisotropic or directional etch to remove the silicon oxide at the bottom of the lined VSTV holes.
8. Deposit and pattern BLM (Ball Limiting Metallurgy) via pads, in contact with the metal capture pads or metal capture vias.
9. Form micro-BGAs (Ball Grid Arrays) on the BLM via pads.
10. Dice the structure (wafer and holder) to form individual wiring structures from the multiplicity of structures formed on the wafer holder.
11. Provide a ceramic carrier with through vias and via pads in an array pattern matching the array pattern of the etched vias and the micro-BGAs.
12. Join micro-BGAs on the SBP to the via pads on the ceramic carrier.
13. Remove the temporary, transparent, glass wafer holder.
14. Make openings to C4 pads on the surface of the BEOL structure.
15. Join chips to the upper surface pads on the multilayer conductor member.

In a second aspect of this invention the process steps are performed in the sequence as follows:
1. Start with a standard silicon wafer.
2. Form shallow via holes about 80 µm-100 µm deep in the wafer surface.
3. Deposit a blanket dielectric layer which isolates the front surface of the silicon wafer and covers the sidewalls of the vias.
4. Deposit a blanket metal via/cap layer covering and filling the via holes.
5. Polish back to the dielectric layer leaving metal vias filling the via holes.
6. Apply multilayer, insulated conductor patterns on the polished surface of the silicon wafer.
7. Form a temporary bond of a temporary, transparent, glass wafer holder to the silicon wafer.
8. Thin the silicon wafer to desired thickness in the range from about 50 µm to about 75 µm to form a UTSW. This will expose the metal vias on the back side of the UTSW.
9. Deposit and pattern the BLM.
10. Form the micro-BGA's on the BLM.

11. Dice the structure to form individual wiring structures from the multiplicity of structures formed on the wafer holder.
12. Provide the ceramic carrier with through vias with a pattern matching that of the etched vias.
13. Join the micro-BGAs to the ceramic carrier vias.
14. Remove the temporary, transparent, glass wafer holder.
15. Join the chips to the upper surface pads provided on the multilayer conductor member.

Experimentation has shown that when a VSTV design is substituted for a TSTV design, the resulting devices are operable and are less expensive than the TSTV devices because the VSTV devices require only a single masking step on the wafer backside instead of two masking steps, and a VSTV design does not limit the silicon carrier thickness to be >150 microns as had been thought prior the present invention. Furthermore, the present invention eliminates the significant problem of achieving a thin and uniform thickness resist layer which is required for imaging of the second via mask used in the tapered via process.

BRIEF DESCRIPTION OF THE DRAWINGS

The foregoing and other aspects and advantages of this invention are explained and described below with reference to the accompanying drawings in which:

FIGS. 2A-2M are schematic sectional diagrams of the process flow for forming an SBP in accordance with the sequence of steps of a first process flow.

FIGS. 3A-3M are schematic sectional diagrams of the process flow for forming an SBP in accordance with the sequence of steps of a second process flow.

FIGS. 5A-5E are schematic sectional diagrams of the process flow for forming an SBP with vias of the VSTV type and buried metal capture pads with metal capture vias reaching up to the VSTVs in accordance with the sequence of steps of a modification of the third process flow.

DESCRIPTION OF THE PREFERRED EMBODIMENTS

Figure 1:
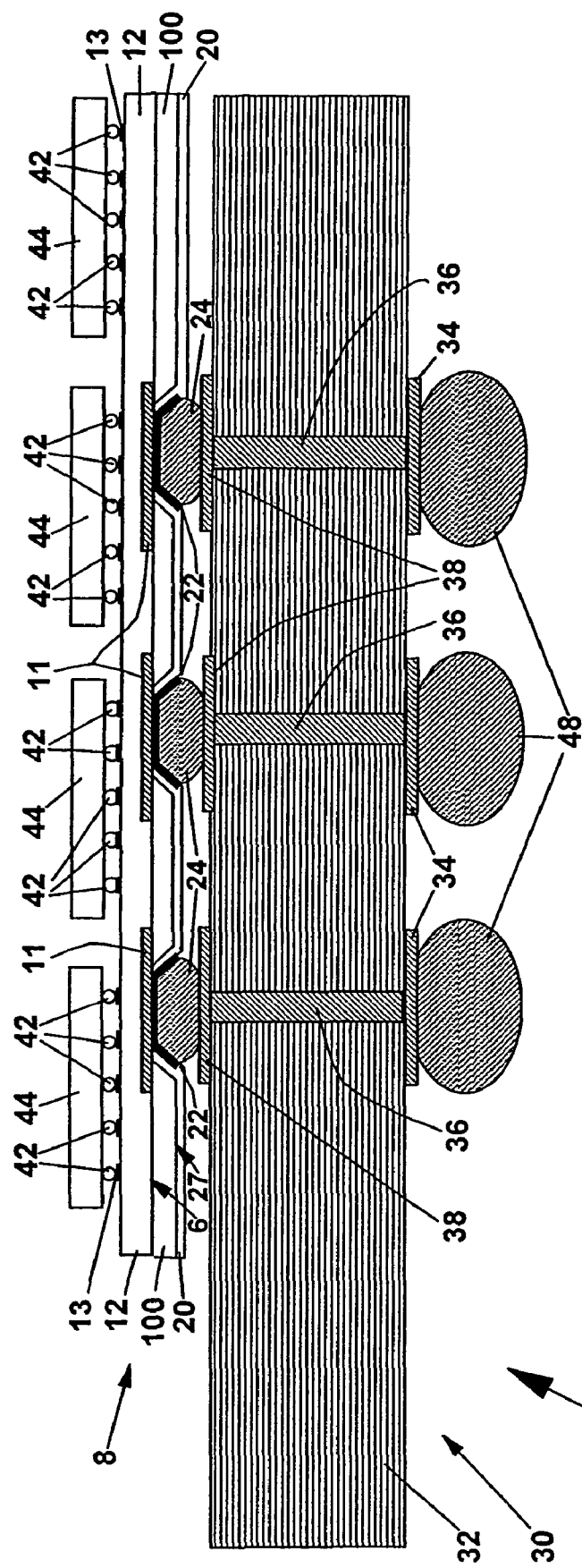
FIG. 1 is a schematic sectional diagram of a combined package including an Silicon Based Package (SBP) mounted on a package carrier manufactured employing a process in accordance with this invention, the steps of which are illustrated by FIGS. 2A-2M.

FIG. 1 is a schematic sectional diagram of an embodiment of a combined package 40 including an Silicon Based Package (SBP) 8 mounted on an MLC (Multi-Layer Ceramic) package carrier 30 in accordance with this invention. FIGS. 2A-2M illustrate the steps of a method in accordance with this invention for forming a package of the kind shown in FIG. 1. Package 8 includes a UTSW 100 with a substantially planar upper surface 6 as well as a substantially planar, thinned reverse surface 27 that is covered, on the lower surface thereof, with a dielectric material 20. An array of BLM metal via pads 22 have been formed extending through openings through the dielectric material 20 and the UTSW 100 to the top surface 6 thereof.

Micro-BGAs 24 have been formed joined to the array of conductive UTSW BLM metal via pads 22 extending from the top surface 6 through to the thinned reverse surface 27 of the UTSW 100. Above each UTSW BLM metal via 22 is a metal capture pad 11, each of which served as an etch stop when the holes in which the UTSW BLM metal via pads 22 are located were being formed. The upper surface of the UTSW 100 and the upper surfaces of the metal capture pads 11 are covered with a standard silicon BEOL structure 12. C4 contact pads 13 are formed arrayed on the top surface of the BEOL structure 12 to which chips 44 with C4 solder balls 42 are joined. The C4 solder balls 42 support semiconductor chips 44 on the array of C4 contact pads 42.

The MLC package carrier 30 includes a carrier body 32 in which a set of conductive, carrier vias 36 have been formed which are shown extending through the carrier body 32. As will be well understood by those skilled in the art, the carrier vias 36 are connected directly or indirectly (as a matter of design choice) from the top to the bottom through the carrier body 32, but for convenience of illustration, the carrier vias 36 are shown extending from the top to the bottom.

The carrier vias 36 extend between a set of conductive BGA pads 38 (which comprise a portion of the Top Surface Metallurgy (TSM) formed on the top surface of the carrier body 32) and bottom pads 34 (which comprise a portion of the Bottom Surface Metallurgy (BSM) formed on the lower surface of the carrier body 32). Optional BGAs balls 48 of a BGA array are shown formed and bonded to the BGA pads 34. Preferably there is a substantial spacing separating the conductive, carrier vias 36 in the ceramic carrier body 32.

Process Flow 1—Silicon Based Packaging with Metal Capture Pad

In this process flow, the metal capture pads 11 are formed during the early stages of the manufacture of an SBP 8.

FIG. 2A shows a silicon wafer 10, which is prepared for the process steps, in accordance with this invention. Preferably, the silicon wafer 10, which has a substantially planar top surface 6 and a substantially planar bottom surface 7, has the usual parameters with a typical diameter, e.g. 6 inches, 8 inches, or 12 inches (15.24 cm, 20.32 cm, or 30.48 cm) and with a typical thickness such as 750 µm.

FIG. 2B shows the SBP 8, which comprises the silicon wafer 10 of FIG. 2A after an array of metal capture pads 11 (e.g. 600 µm diameter and spaced 400 µm apart) has been formed on the top surface 6 thereof The first step in the process was to deposit a blanket metal film (not shown) which was then patterned by forming a photoresist mask (not shown) and etching to form metal capture pads 11 in a layout which is compatible in its configuration with the configuration (shown in FIGS. 1 and 2I) of the micro-BGA of balls 24.

FIG. 2C shows the SBP 8 of FIG. 2B after formation a standard silicon BEOL structure 12 comprising a multilevel dielectric and interconnection structure formed over the top surface 6 of silicon wafer 10 covering the metal capture pads 11 and covering exposed portions of the top surface of silicon wafer 10. The BEOL structure 12 is of the kind well known to those skilled in the art which provides electrical signal and power line interconnections (not shown for convenience of illustration) within the ultimate packaging structure shown in FIG. 1 to connect to the C4's 42 of chips 44 and any other devices supported on the packaging structure, as well as the metal capture pads 11.

An array of C4 pads 13, formed above the standard silicon multi-level BEOL structure 12, connect to wiring in the BEOL structure 12. The C4 pads 13 can be used to perform an electrical test for opens/shorts of all chip-to-chip nets (wiring).

Then, after the electrical testing step, the C4 pads 13 and BEOL structure 12 are coated, as shown in FIG. 2C with a thin overcoat 14 preferably composed of polyimide to protect the structure during the intermediate steps of the process.

Figure 2D:
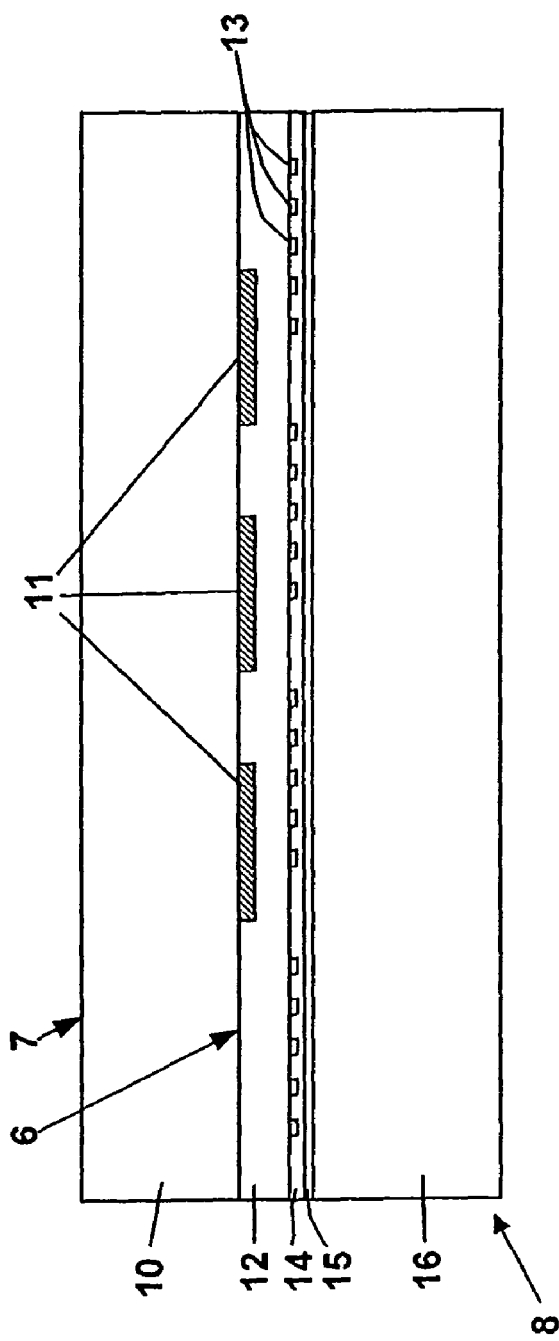

FIG. 2D shows the SBP 8 of FIG. 2C, that was inverted, after joining the interconnection structure 12 (above the "top" surface 6 the silicon wafer 10) to a temporary, transparent, glass wafer holder 16, using a thin film 15 of a releasable adhesive such as polyimide. The SBP 8 and temporary, transparent, glass wafer holder 16 were inverted, after joining the SBP 8 to the temporary, transparent, glass wafer holder 16. Use of the temporary, transparent, glass wafer holder 16 permits normal handling of the SBP 8 instead of extraordinary techniques that would be required if an ultra-thin wafer (in place of silicon wafer 10) were to be handled without the mechanical support of a temporary, transparent, glass wafer holder 16.

Figure 2E:
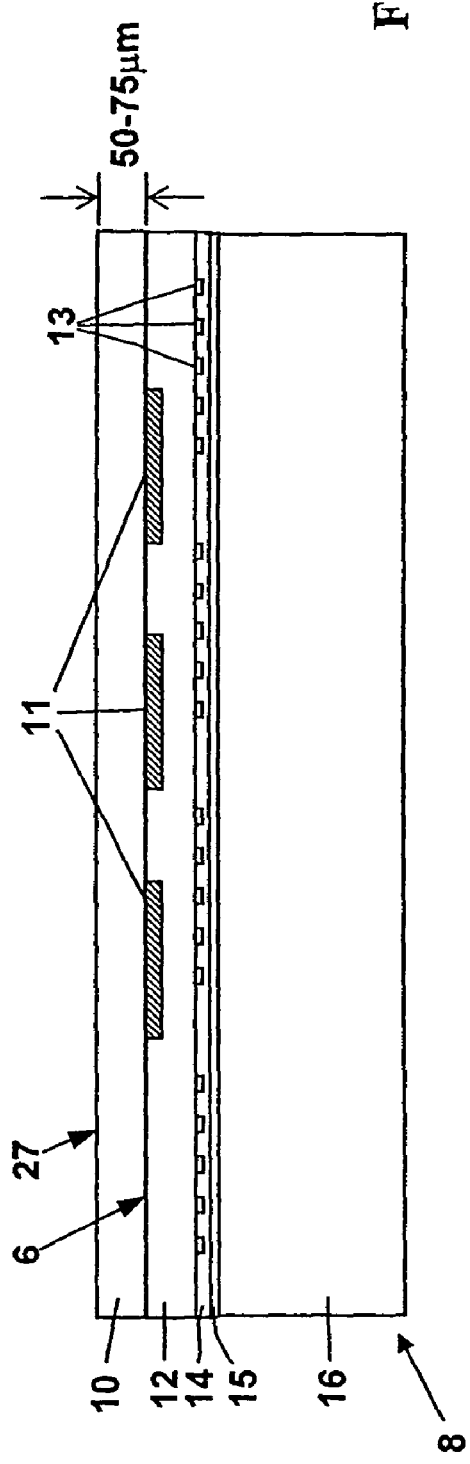

FIG. 2E shows the SBP 8 of FIG. 2D after the silicon wafer 10 has been thinned to form a UTSW 100 on the top of SBP 8. The silicon wafer 10 is thinned to the desired/appropriate thickness by performing a subtractive process removing material from the reverse surface 7 to form a substantially planar, thinned reverse surface 27. Preferably, the silicon wafer 10 is thinned by Chemical Mechanical Planarization/Polishing (CMP) processing. An alternative technique for thinning the silicon wafer 10 is plasma processing or the like.

As shown in FIG. 2E, the UTSW 100 has a thickness of about 50-75 μm from the "top" surface 6 to the thinned reverse "bottom" surface 27 thereof. The thickness of the silicon wafer 100 is reduced from the thickness of silicon wafer 10 which conventionally would be about 750 μm. Because the silicon wafer 10 was joined to the temporary, transparent, glass wafer holder 16 (FIG. 2D) before thinning, it is unnecessary to handle the UTSW 100/BEOL structure 12 with the C4 pads 13, etc. as a separate structure. Thus, the probability of damaging the thin UTSW 100 is minimized because of the structural support provided by the temporary, transparent, glass wafer holder 16.

Figure 2F:
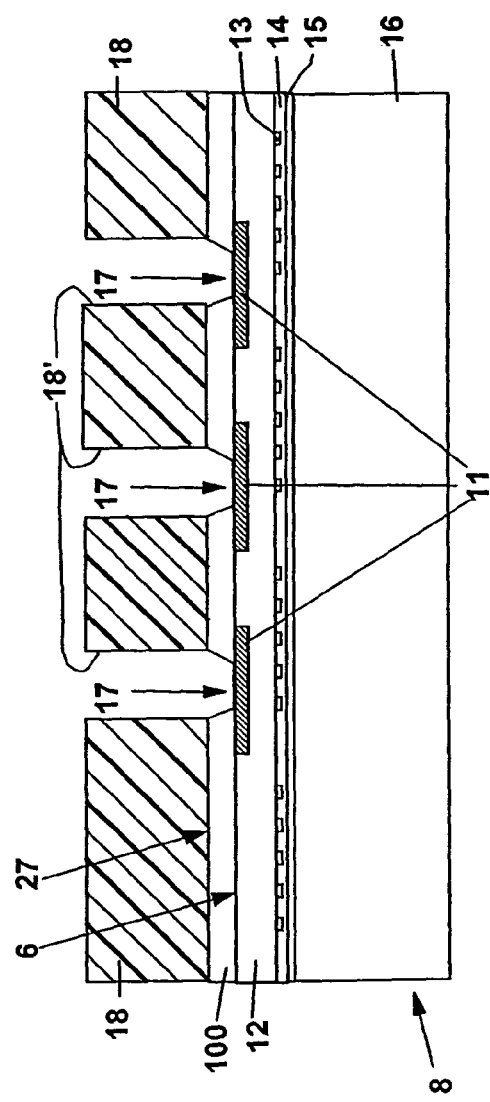

FIG. 2F shows the SBP 8 of FIG. 2E with UTSW 100 covered with a temporary photoresist mask 18 formed above the inverted thinned reverse "bottom" surface 27 of the UTSW 100. Mask 18 is formed with an array of open via windows 18' there-through which reach down through the thinned reverse "bottom" surface 27 of the thin UTSW 100 that is shown in FIG. 2F facing upwardly.

It is noted at this point, that by thinning the silicon wafer 10, skipping for a moment to allude briefly to FIG. 2H (which is described in more detail below), a reasonable diameter BLM metal via 22 can be created with conventional etching techniques without weakening the UTSW 100 excessively. While it would seem that making the wafer 10 thinner would make it weaker, in fact without thinning, a very large diameter via would be needed requiring a larger plug, thus making the structure weaker because of the Thermal Coefficient of Expansion (TCE) forces exerted by such a large plug which would expand more than a smaller plug.

The point here is that with a UTSW 100 with thickness of the order of 75 μm, one can create the via openings shown in FIG. 2F with a silicon wet etch process. Such a process typically provides tapered vias with a 45 degree wall angle. So with a via pitch of 400 μm for the micro-BGA BLM metal via pads 22, the top and bottom via diameters will be 300 μm and 150 μm respectively for a 75 μm thick Si wafer. Without the support of the glass wafer holder 16, one might require wafers with thicknesses in the range of 200 μm or more to allow handling during the many process steps required to build the BEOL structure. The top diameter of the via opening 17 using the wet-etch technique described above will be 550 μm for a via bottom diameter of 150 μm. This will be greater than the via pitch, and all the vias will be shorted.

In the past, it was perceived that much more expensive vertical-wall via formation and metal filling techniques would be required for wafers thicker than 150 μm. Heretofore, this had been considered to be the key advantage of employing the UTSW coupled with a transparent glass wafer holder during BEOL processing. However, recently we have discovered that employing a hard mask and employing dry etching of the silicon of the UTSW 100 to produce vias with vertical sidewalls will produce a very satisfactory result as described below with respect to the embodiment shown by FIGS. 4A-4R.

Then using the access provided through the open windows 18', tapered via openings 17 have been etched through the thickness (e.g. 50-75 μm) of UTSW 100 (with a silicon etchant) to expose surface areas of the top surfaces of the metal capture pads 11 which are located below the via windows 18' in alignment therewith. The metal capture pads 11 serve as etch stops during the etching through the UTSW 100, as will be well understood by those skilled in the art. Each of the via openings 17 is centered over a metal capture pad 11.

Figure 2G:
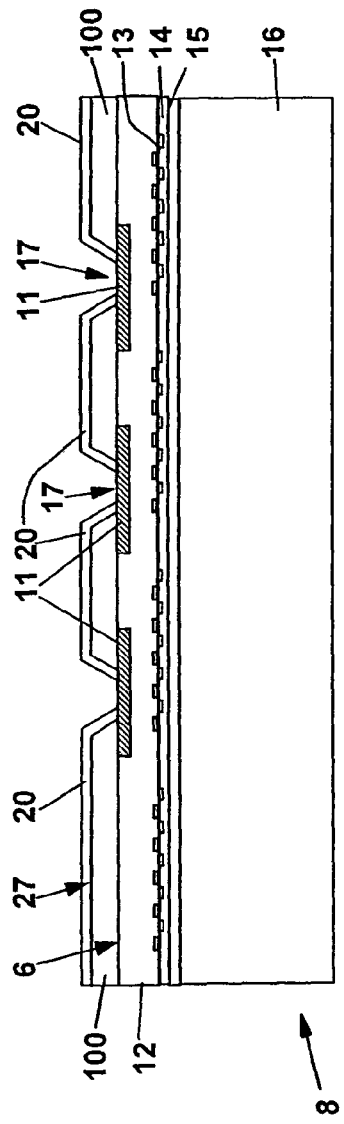

FIG. 2G shows the SBP 8 of FIG. 2F after removing mask 18, followed by deposition of a blanket dielectric material 20 (e.g. silicon oxide or polyimide) which isolates the upwardly facing "bottom" surface of the UTSW 100. Preferably, blanket, dielectric, isolation layer 20 comprises a CVD silicon oxide layer.

Etching removes the silicon oxide isolation layer 20 covering the metal capture pads 11. Preferably the SBP 8 is coated with photoresist (not shown), which photoresist is then exposed to a pattern through a mask set. The photoresist is then developed exposing regions of the isolation layer 20 above metal capture pads 11. Then exposed portions of isolation layer 20 are removed by RIE (Reactive Ion Etching).

The result is that the silicon oxide isolation layer 20 covers all exposed surfaces of the silicon of the UTSW 100.

Figure 2H:
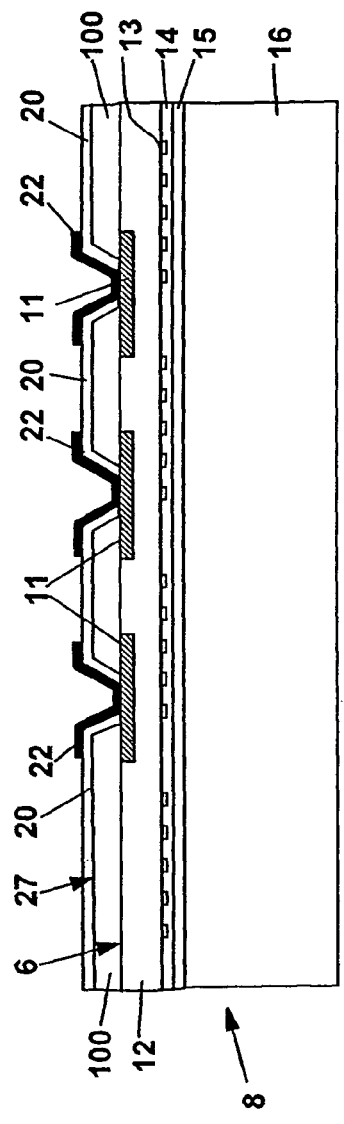

FIG. 2H shows the SBP 8 of FIG. 2G after formation of conventional BLM metal via 22 over the dielectric isolation layer 20 by depositing and patterning BLM metallurgy for a micro-BGA, as will be well understood by those skilled in the art. The BLM metal via 22 extends through the UTSW 100 and into contact with the exposed surfaces of the metal capture pads 11 and reaches over the layer 20 covering the sidewalls of the via holes 17 and extends around the periphery of the via holes 17. The BLM metal via 22 provides pads for the micro-BGA balls 24.

Figure 2I:
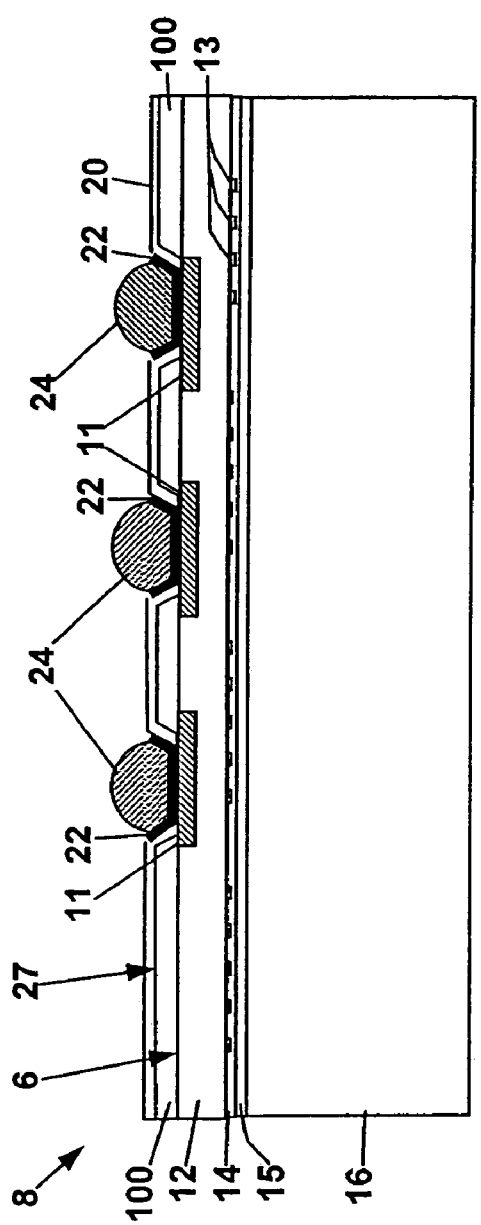

FIG. 2I shows the SBP 8 of FIG. 2H, which has been completed by the formation of an array of micro-BGA balls 24 comprising a set of solder ball connectors which are bonded to the BLM metal via layers 22 and which are thereby interconnected to the array of metal capture pads 11. The micro-BGA balls 24 are ready to be connected to the package carrier 30 shown in FIGS. 1 and 2J. Thus, the micro-BGA balls 24 make contact with the metal capture pads 11 through the BLM metal via pads 22 that extend through the thickness of the UTSW 100.

At this point, if it is required to dice the structure of the SBP 8 to form individual wiring structures from the multiplicity of structures formed on the temporary, transparent, glass, wafer holder 16, as is well understood by those skilled in the art.

Figure 2J:
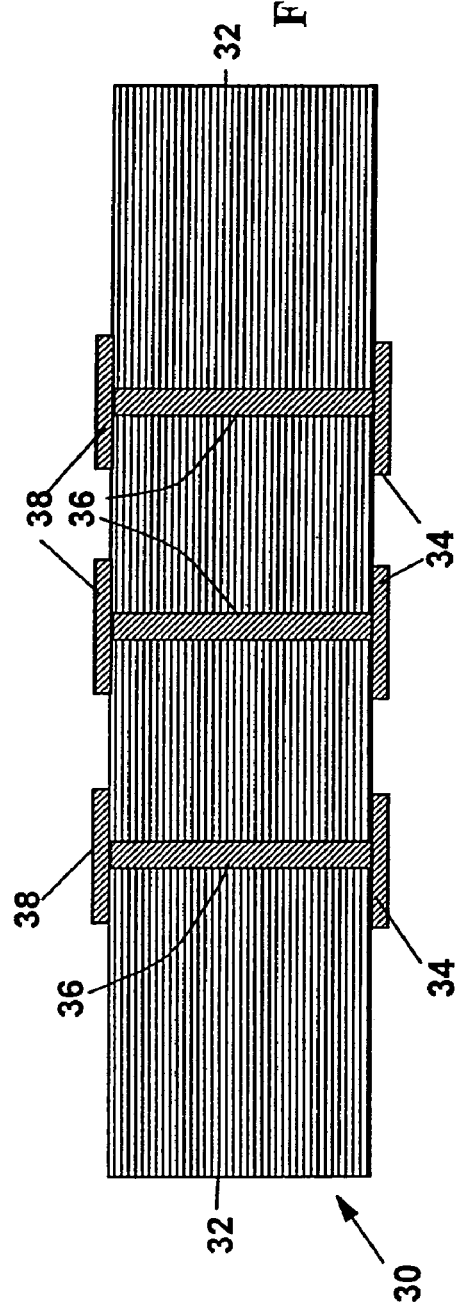

FIG. 2J shows a MLC carrier 30, which has been built starting with a ceramic carrier body 32. There is a set of conductive carrier vias 36, several of which are shown for purposes of illustration, that extend through the carrier body 32 from the top to the bottom thereof.

The carrier vias 36 extend between a set of conductive BGA pads 38 (that comprise a portion of the TSM formed on the top surface of the carrier body 32) and a corresponding set of bottom pads 34 (comprising a portion of the BSM formed on the lower surface of the carrier body 32). Preferably, substantial spacing separates the conductive carrier vias 36 in the ceramic carrier body 32.

FIG. 2K shows a combined package 40 comprising the SBP 8 of FIG. 2I which has been reinverted with the temporary, transparent, glass wafer holder 16 on the top and the micro-BGAs 24 on the bottom. The micro-BGAs 24 are bonded to the BGA pads 38 on the top of the ceramic carrier 30 of FIG. 2J.

FIG. 2L shows the combined package 40 of FIG. 2K from which temporary, transparent, glass wafer holder 16 has been released and removed from the surface of the SBP 8 by releasing the releasable adhesive, thin film 15. In the case of a thin film 15 of polyimide, the releasing step can be performed by laser ablation of the polyimide layer with laser radiation through the transparent, temporary, glass wafer holder 16. The step of laser ablation is employed to remove only a few Angstroms of material which is sufficient to achieve the release of the transparent, temporary, glass wafer holder 16.

Next, the thin overcoat 14 (e.g. polyimide film 14) is patterned to form openings in the overcoat 14 to expose the top surfaces of the C4 pads 13.

The solder joint pads 13 underneath the polyimide layer 14 have already been formed during the fabrication of the UTSW 100. BEOL processes cannot be used after the diced UTSW 100 is joined to the ceramic carrier 32. The processes such as plating or wet etching of a seed layer would be incompatible with the solder joints 24 on the UTSW. The metallization for solder joining pads 13 can be: Ti/W—Cr/Cu/Au or Cr/Cu/Ni/Au Cr/Cu/Ti/Au, Cr/Cu/Pd/Au etc. The key point is that these metallization layers must be formed on the UTSW 100 prior to the polyimide overcoat layer 14, prior to formation of the solder bumps 24.

FIG. 2M shows the combined package 40 of FIG. 2L after chips 44 with C4 solder balls 42 have been joined to the SBP 8 by bonding by the array of C4 solder balls 42 to the array of C4 pads 13. After the chips 44 are joined to the SBP 8, the combined package 40 is tested. If needed, a set of BGAs balls 48 of a BGA array are formed and bonded to the BGA pads 34.

Process Flow 2: Silicon Based Packaging

Figure 3G:
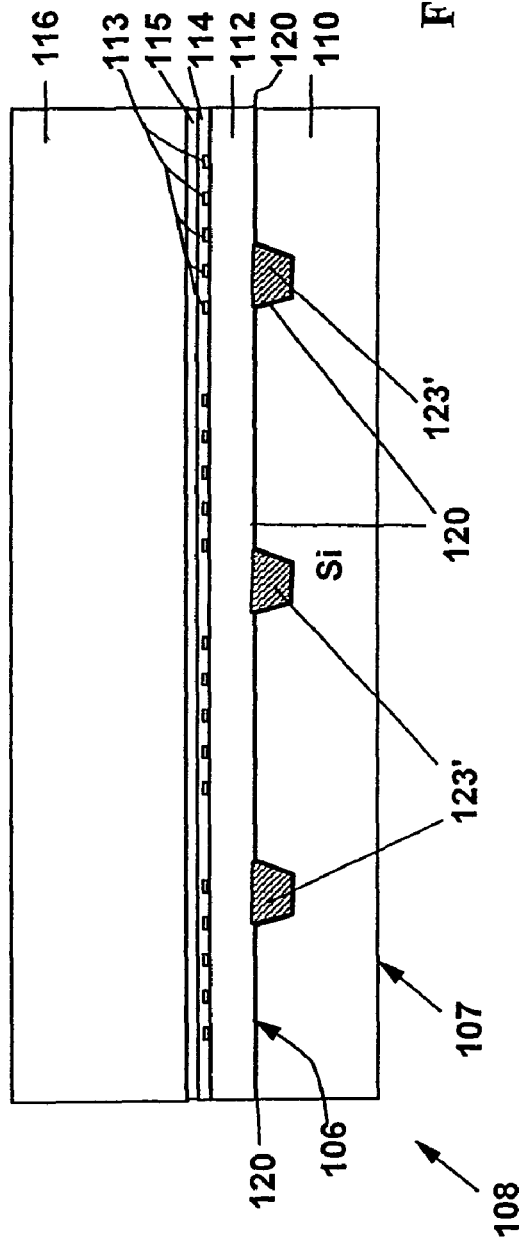

FIG. 3A shows that the first step in the second sequence of process steps, in accordance with this invention. This second embodiment of the invention avoids the use of metal capture pads in the manufacture of an SBP 108 because of the automatic self-alignment of the through vias 123' (as described below with reference to FIGS. 3E-3I). Preferably, the SBP 108 initially comprises a silicon wafer 110 with usual parameters e.g. a typical diameter such as 6 in., 8 in., or 12 in. (15.24 cm, 20.32 cm, or 30.48 cm) and with a typical thickness such as 750 µm.

FIG. 3B shows the SBP 108 of FIG. 3A with an array of empty via holes 117 (e.g. 200 µm diameter and spaced 800 µm apart) formed on the top surface 106 of the silicon wafer 110 by the process described below. For example, via holes 117 are to be etched to a depth of about 80 µm to about 100 µm for a UTSW 200 of FIG. 3H which will have a lesser thickness than the empty via holes 117. For example, after thinning of the silicon wafer 110, when it is converted into the UTSW 200 shown in FIG. 3H, the UTSW 200 will preferably have a thickness of from about 50 µm to about 75 µm. In any event, in order to form vias, the empty via holes 117 must be at least slightly deeper than the ultimate thickness of the UTSW 200.

Figure 3H:
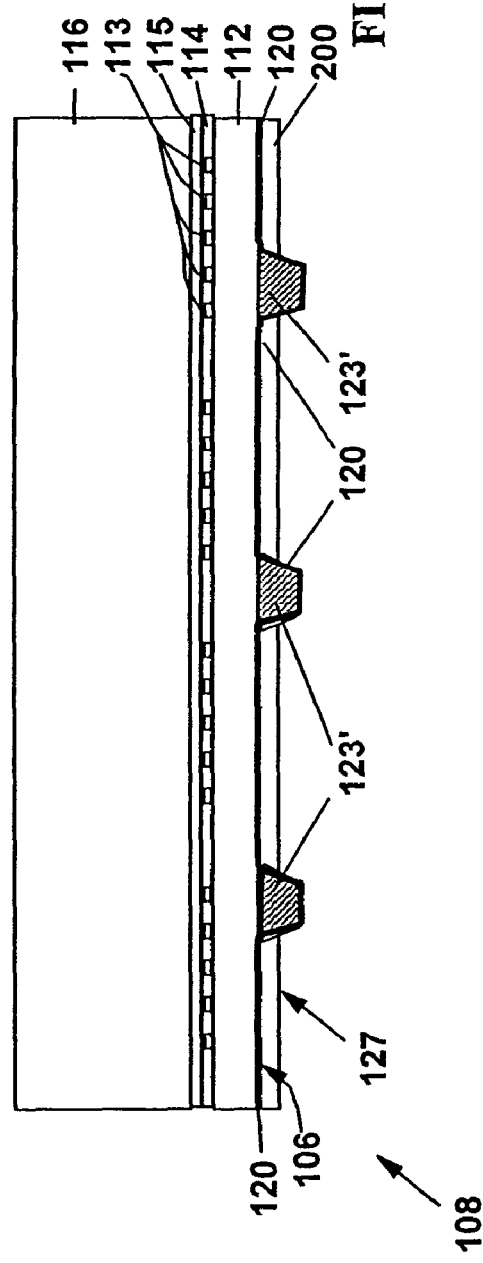
Figure 3I:
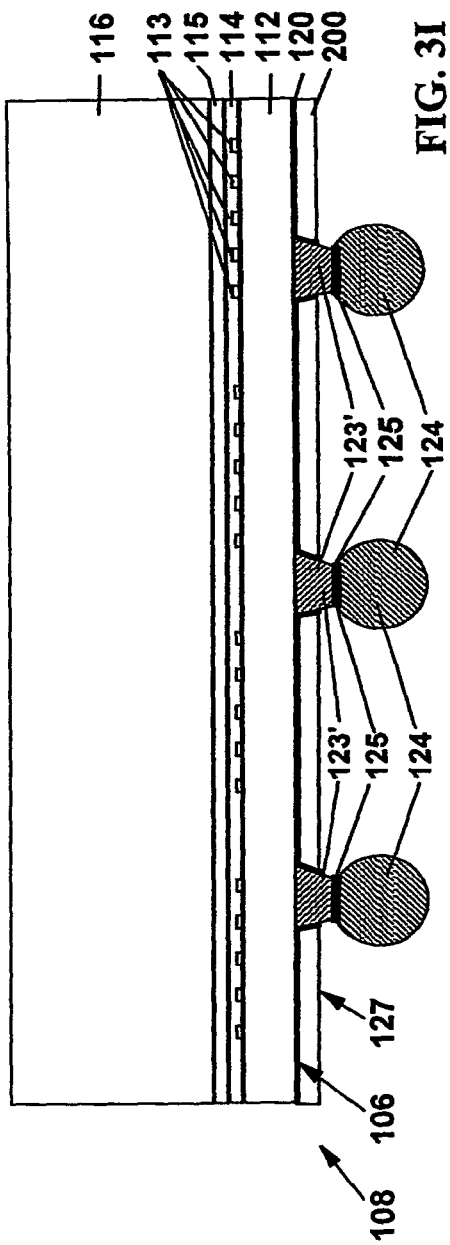

The first process step is to cover the top surface 106 of the silicon wafer 110 with a photoresist mask 118 that is patterned to form via windows 118' in a layout that is compatible in its configuration with the configuration of the micro-Ball Grid Array (micro-BGA) of balls 124, which is shown in FIG. 3I. Using mask 118, the silicon wafer 110 is selectively etched through windows 18' to form an array of empty via holes 117 reaching through the top surface 106 of the silicon wafer 110.

FIG. 3C shows the SBP 108 of FIG. 3A after removal of the mask 118 from the top surface 106 of the silicon wafer 110 followed by a step of oxide growth or oxide deposition of a blanket dielectric thin film layer 120 (e.g. silicon oxide) that covers the top surface 106 of the silicon wafer 110 and the top surfaces of the empty via holes 117 with a thin film to provide isolation of the silicon wafer 110 from subsequent layers to be deposited thereon. The blanket dielectric layer 120 covers all of the remaining portions of the top surface 106 of the silicon wafer 110 and the blanket dielectric layer 120 also cover all surfaces of the empty via holes 117 (leaving partially filled, narrower via holes 117'). Preferably, dielectric layer 120 is composed of silicon dioxide deposited by PECVD (Plasma Enhanced Chemical Vapor Deposition) or thermal oxide.

FIG. 3D shows the SBP 108 of FIG. 3C after deposition of a thick blanket metal via/cap layer 123 covering all surfaces of the blanket dielectric layer 120 and filling the narrower via holes 117'. The metallurgy of the blanket metal via/cap layer 123 is selected to be compatible with a micro-BGA array.

FIG. 3E shows the SBP 108 of FIG. 3D after forming an array of separate metal vias 123' from the via/cap layer 123 that has been planarized (i.e. removed) down to the top surface of the dielectric layer 120 by polishing/planarizing the via/cap layer 123 leaving the blanket dielectric layer with the partially filled, narrower via holes 117' filled with the remainder of the metal layer 123 thereby forming an array of metal vias 123' which comprise electrical conductors.

FIG. 3F shows the SBP 108 of FIG. 3E, after formation of a standard silicon (Si) BEOL multilayer wiring structure 112. The BEOL structure 112 comprises a multilevel dielectric and interconnection structure formed over the top surface of the SBP 108 covering the vias 123' and covering exposed portions of the dielectric layer 120. The BEOL structure 112 is of the kind well known to those skilled in the art, that provides electrical signal and power line interconnections (not shown for convenience of illustration) within the ultimate packaging structure shown in FIG. 3M to connect to the C4's 142 and the chips 144 and any other devices supported on the SBP 108. An array of C4 pads 113, (that connect to wiring in the BEOL structure 112), are formed above the standard silicon multi-level BEOL structure 112. The C4 pads 113 can be used to perform an electrical test for opens/shorts of all chip-to-chip nets (wiring).

Then, after the electrical testing step, the top surface of SBP.108, including the C4 pads 113 and the BEOL structure 112, is coated, as shown in FIG. 3F with a thin overcoat layer 114. The overcoat layer 114 is preferably composed of polyimide to protect the structure during the intermediate steps of the process.

FIG. 3G shows the SBP 108 of FIG. 3F that has been joined to a temporary, transparent, glass wafer holder 116 using a thin film 115 of a releasable adhesive bonded to the thin overcoat layer 114. The provision of the temporary, transparent, glass wafer holder 116 permits the normal handling of the SBP 108 instead of the extraordinary techniques that would be required if a fragile ultra-thin wafer 200 of FIG. 3H (in place of the silicon wafer 110 of FIG. 3G) were to be handled without a temporary, transparent, glass wafer holder 116.

FIG. 3H shows the SBP 108 of FIG. 3G after the silicon wafer 110 has been thinned to form another form of a UTSW 200 on the bottom of the SBP 108 exposing portion of the dielectric layer 120 and the lower portion of the metal vias 123' at the bottoms of via holes 117. The silicon wafer 110 of FIG. 3B has been thinned to the desired/appropriate thickness by a subtractive process such as Chemical Mechanical Planarization/Polishing (CMP) processing or alternative plasma processing or the like to form the UTSW 200. The UTSW 200 has a thickness of about 50 µm-75 µm that has been reduced from the thickness of the silicon wafer 10 that would conventionally be about 750 µm. Because the silicon wafer 10 was temporarily bonded/joined to the temporary, transparent, glass wafer holder 116, it is unnecessary to handle the UTSW 200/BEOL structure 112/and C4 pads 113, etc. as a separate structure. Thus the probability of damaging the thin UTSW 200 is minimized because of the structural support provided by the temporary, transparent, glass wafer holder 116.

By thinning the silicon wafer 110, a set of metal vias 123' with a reasonable diameter, coated with the dielectric 120, can be exposed with conventional etching techniques without excessively weakening the UTSW 200. Since the metal vias 123' and dielectric layer 120 are deeper than the thickness of the UTSW 200, the metal vias 123' and the layer 120 project below the UTSW 200. Next, exposed portions of the dielectric layer 120 are removed by RIE or the like.

FIG. 3I shows the SBP 108 of FIG. 3H after removal of the exposed portion of the layer 120 from the portion of the metal vias 123' below the UTSW 200 followed by attachment of micro-BGAs 124 to metal layers 125 on the bottom of the vias 123' of the SBP 108 in the conventional manner.

Figure 3J:
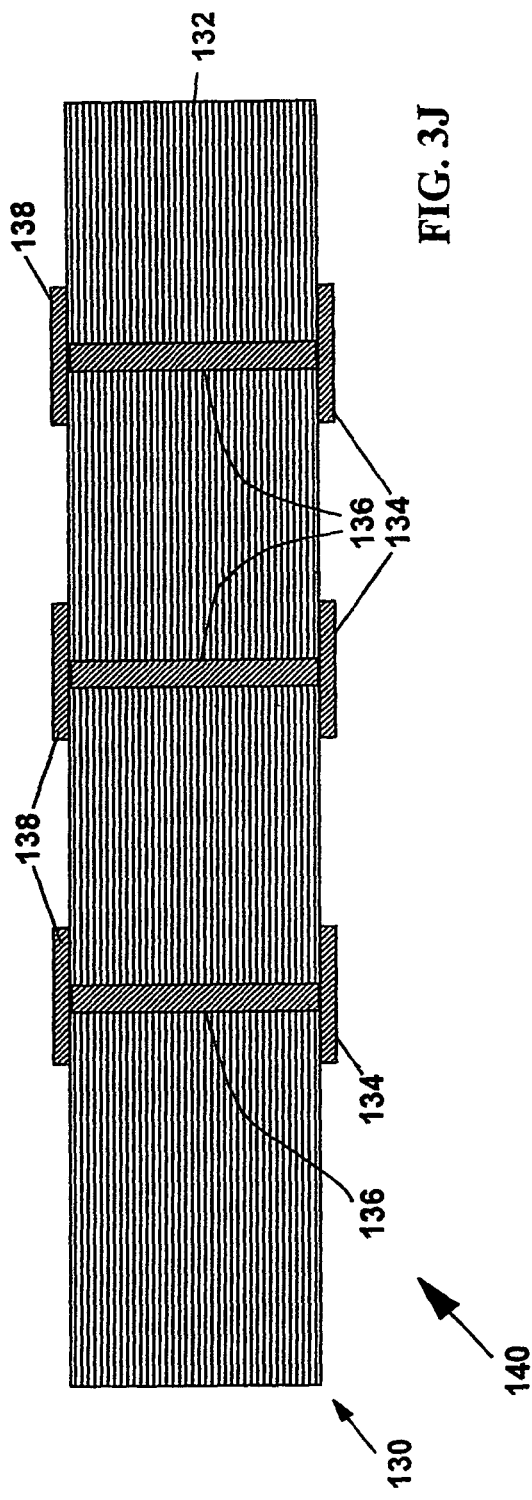

FIG. 3J shows a MLC carrier 130, which has been built with a carrier body 132. There are numerous conductive, carrier vias 136, a few of which are shown for purposes of illustration that can extend from the top to the bottom through the carrier body 132, or that can connect to intermediate layers as described in connection with FIG. 2J, as will be well understood by those skilled in the art. The carrier vias 136 extend between a set of conductive BGA pads 138 (comprising a portion of the TSM formed on the top surface of the carrier body 132) and bottom (BGA) pads 134 (comprising a portion of the BSM formed on the lower surface of the carrier body 132).

At this point, if it is required, the structure of the SBP 108 is diced to form individual wiring structures from the multiplicity of structures formed on the temporary, transparent, glass, wafer holder 116, as will be well understood by those skilled in the art.

FIG. 3K shows a combined package 140 comprising the SBP 108 of FIG. 3I, which has been joined to the ceramic carrier 130 by bonding the micro-BGAs 124 to the BGA pads 138 on the top of the ceramic carrier 130 of FIG. 3J.

Figure 3L:
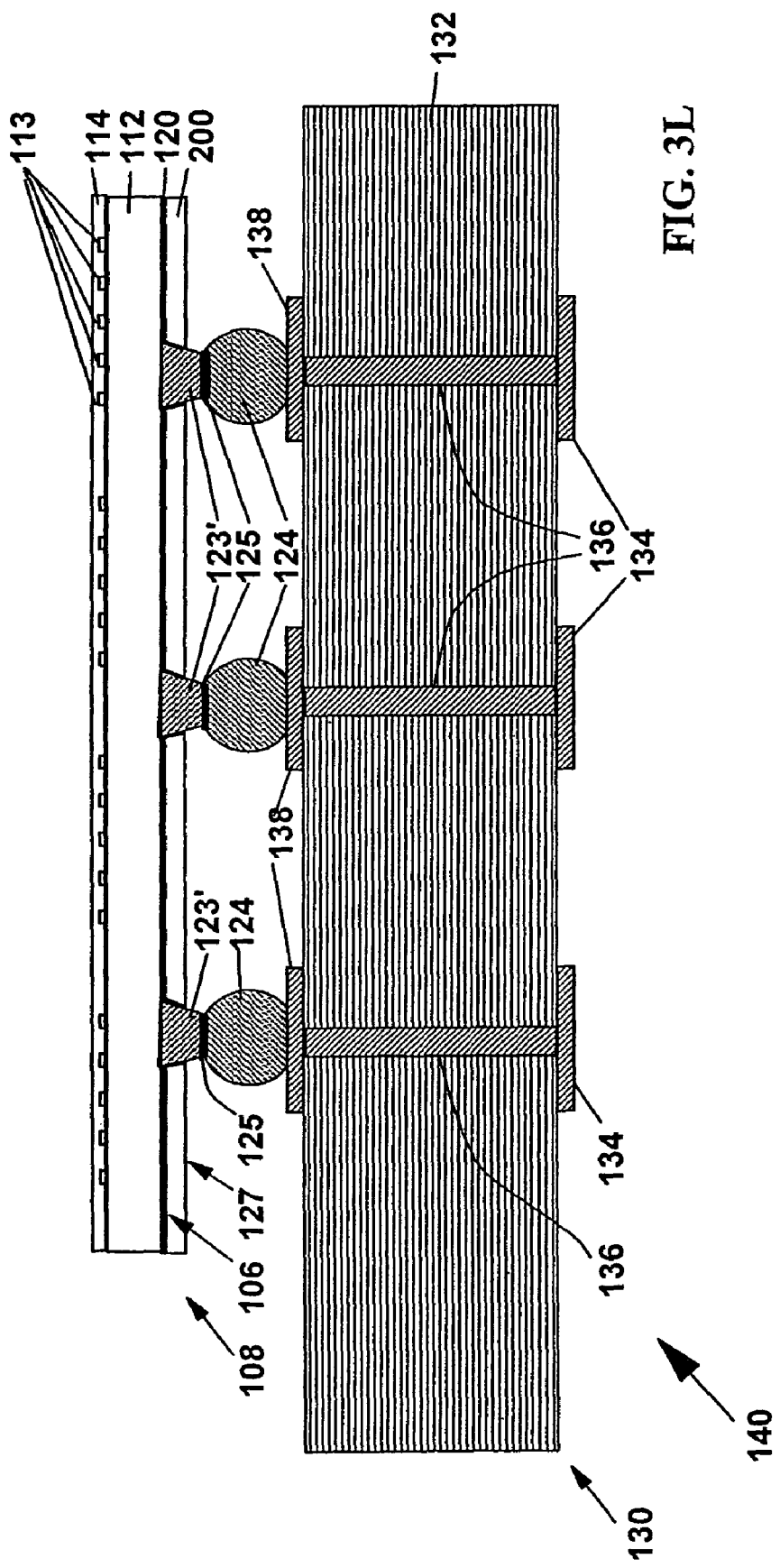

FIG. 3L shows a combined package 140 comprising the SBP 108 of FIG. 3K after removal of the temporary, transparent, glass wafer holder 116 by releasing the releasable thin film 115. In the case of a thin film 15 of polyimide, the releasing step can be performed by laser ablation of the polyimide layer by exposure of the polyimide layer through the transparent temporary, glass wafer holder 116. The step of laser ablation transmits laser radiation through glass wafer holder 116 thereby removing only a few Angstroms of material, that is sufficient to achieve the release of the transparent, temporary, glass wafer holder 116 from the SBP 108.

Next, the thin overcoat 114 (e.g. polyimide film 114) is patterned to form openings in the overcoat 114 to expose the C4 pads 113.

Figure 3M:
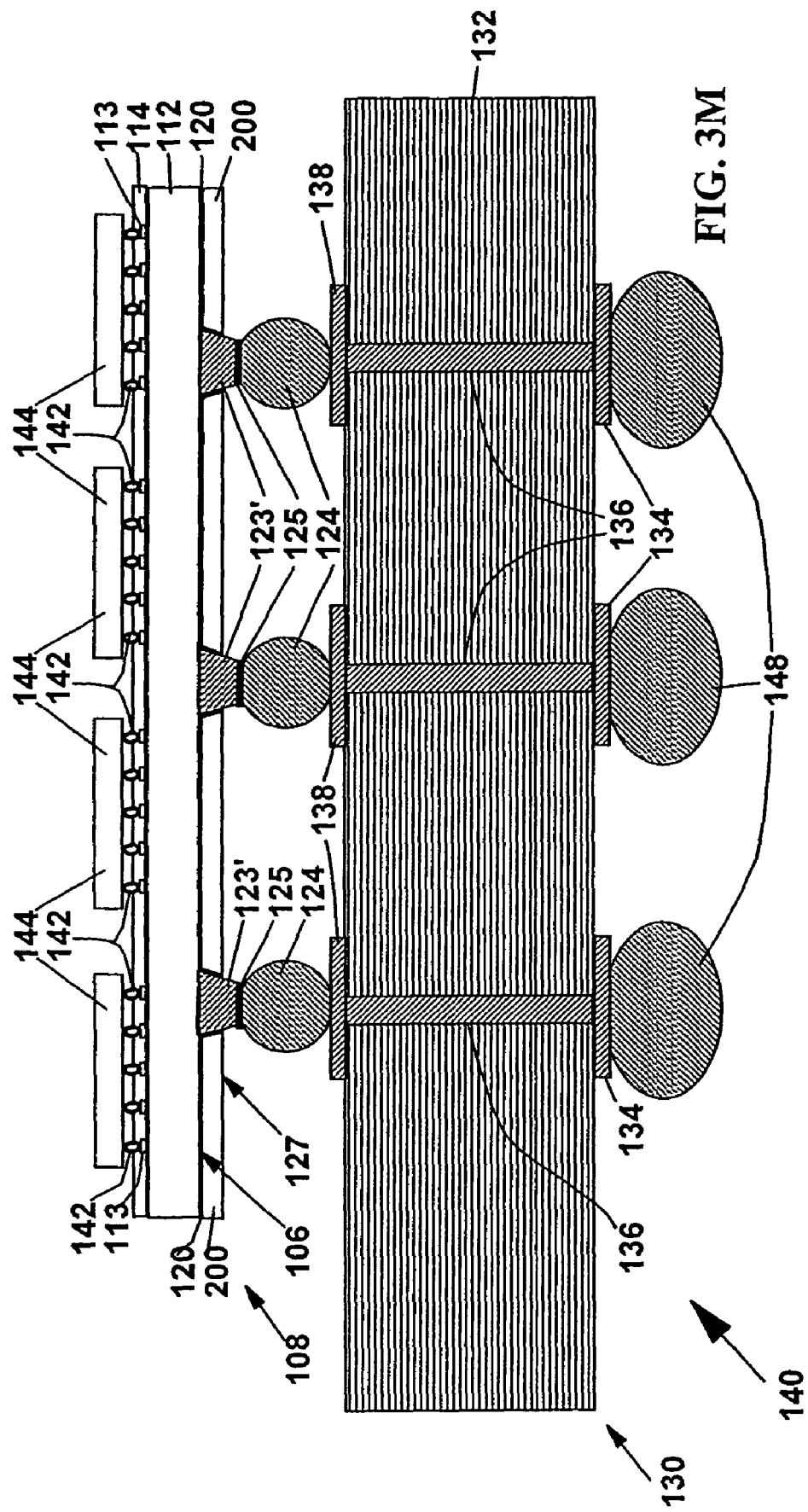

FIG. 3M shows the combined package 140 of FIG. 3L after chips 144 have been bonded by the C4 solder balls 142 to the SBP 108. After the chips 144 are joined to the SBP 108, the combined package 140 is tested. If needed, a set of BGAs balls 148 of a BGA array are formed and bonded to the BGA pads 134.

Figure 4F:
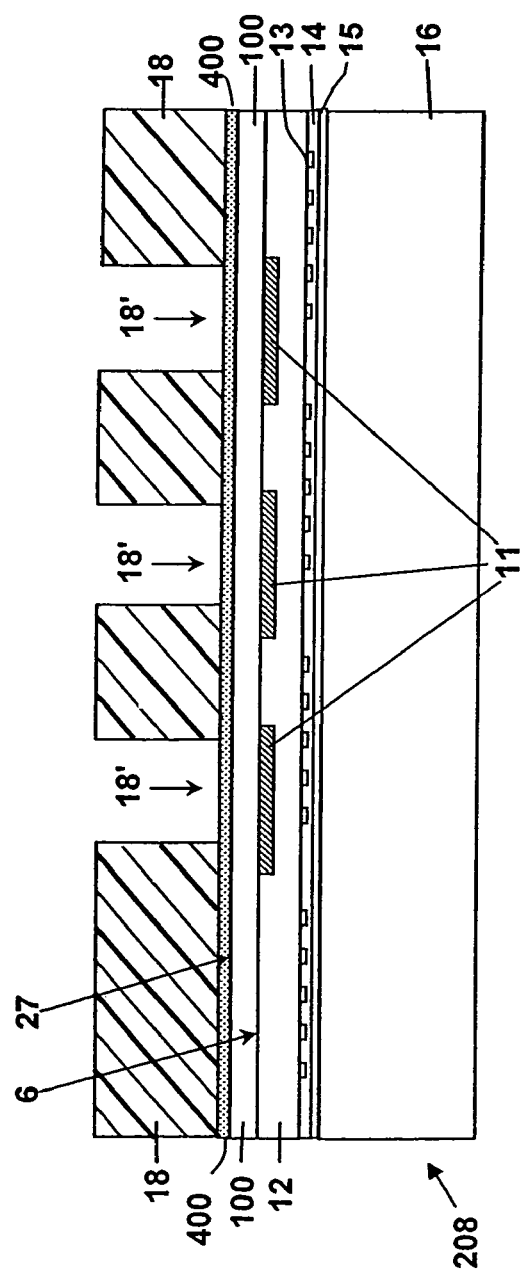
FIGS. 4A-4Q are schematic sectional diagrams of the process flow for forming an SBP with vias of the Vertical Sidewall Through Via (VSTV) type in accordance with the sequence of steps of a third process flow.
Figure 4G:
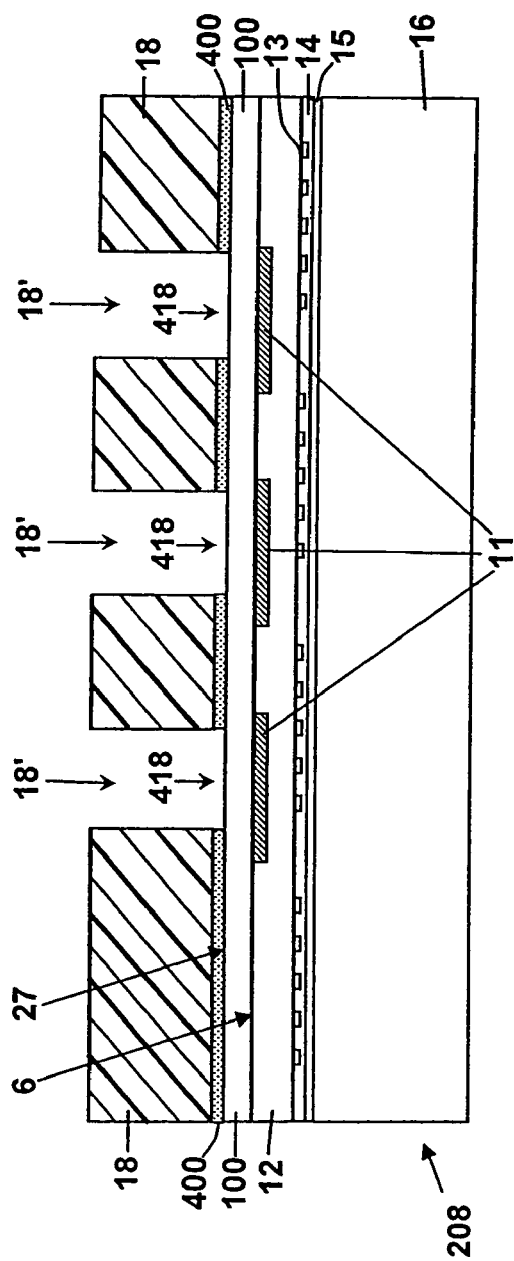
Figure 4H:
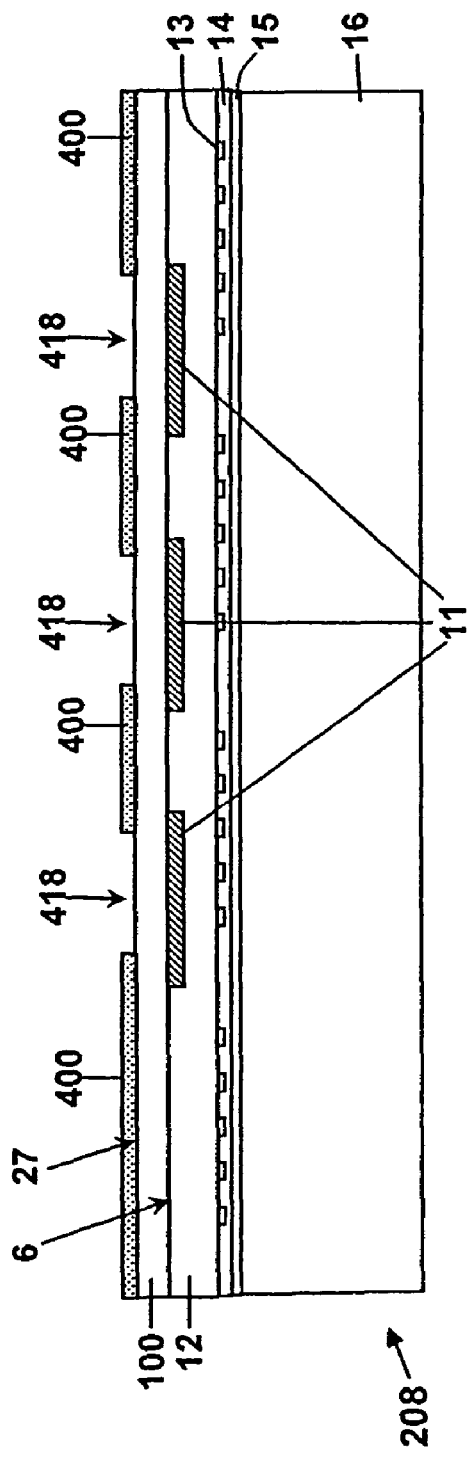
Figure 4I:
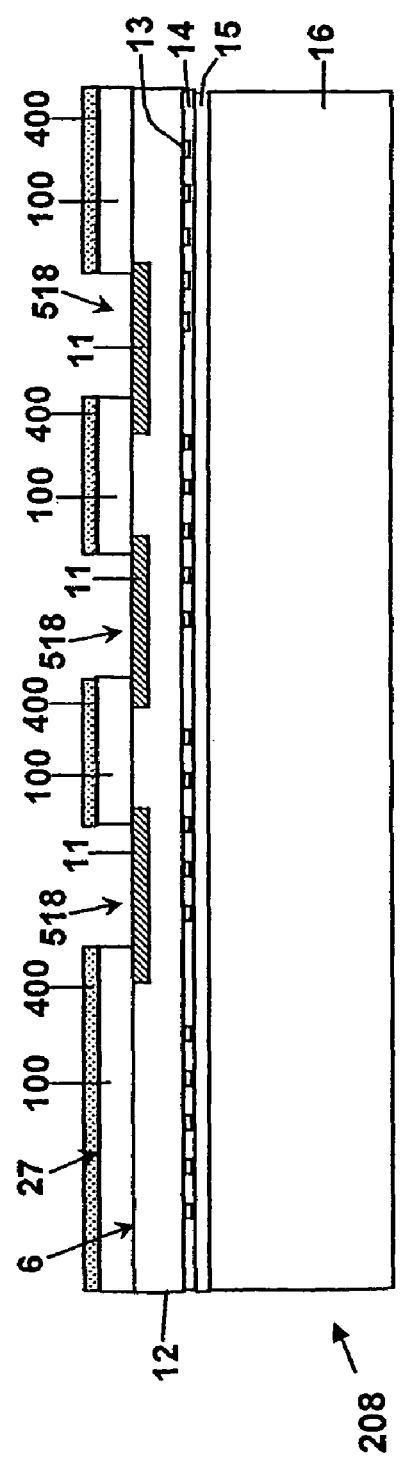
Figure 4J:
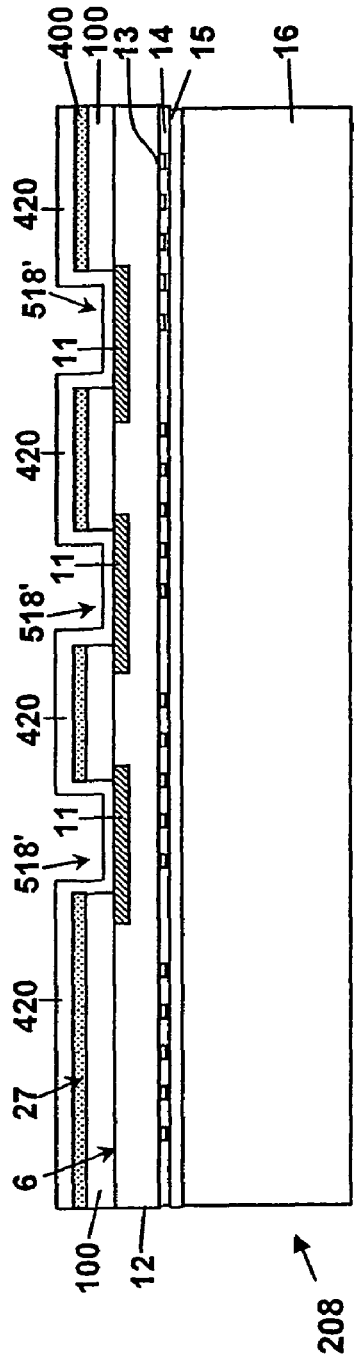
Figure 4K:
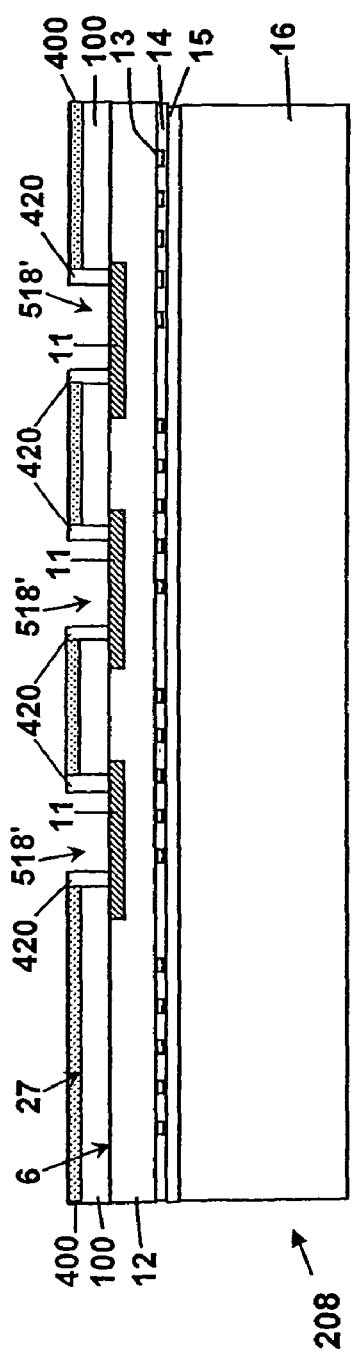
Figure 4Q:
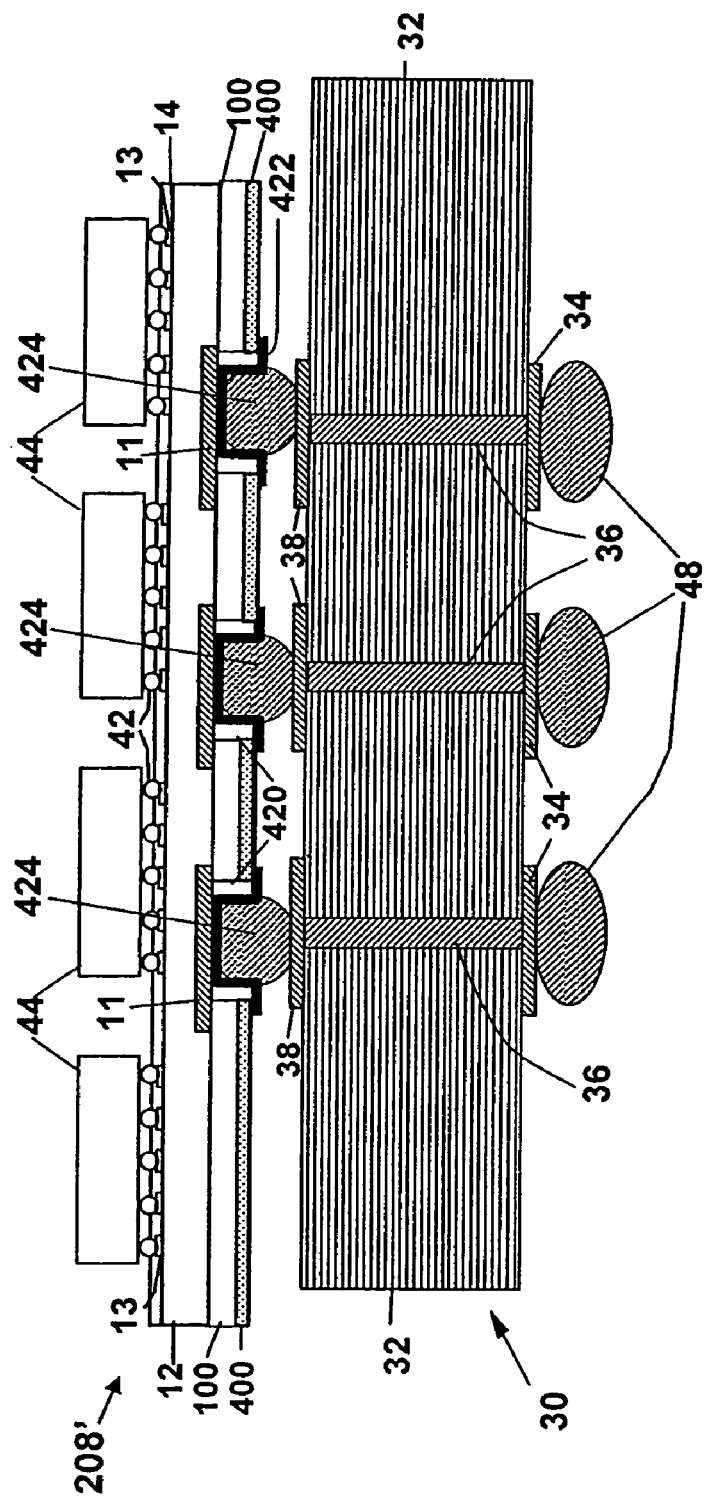

Process Flow 3—Silicon Based Packaging with Through Vias with Vertical Sidewalls and Metal Capture Pads FIGS. 4A-4Q are schematic sectional diagrams of the process flow for forming an SBP with VSTVs (Vertical Sidewall Through Vias) according to a sequence of steps of a third process flow that is a modification of the process of FIGS. 2A-2M. In this process flow, the metal capture pads 11 are formed during the early stages of the manufacture of an SBP 208 with VSTVs.

FIG. 4A shows a silicon wafer 10 which is prepared for the process steps, in accordance with this invention. Preferably, the silicon wafer 10, which has a planar top surface and a planar bottom surface 7, has the usual parameters with a typical diameter e.g. 6 in., 8 in., or 12 in, (15.24 cm, 20.32 cm, or 30.48 cm) and with a typical thickness such as 750 µm.

FIG. 4B shows the SBP 208 comprising the silicon wafer 10 of FIG. 2A after an array of metal capture structures in the form of a set of metal capture pads 11 (e.g. 100 µm diameter and spaced 25 µm apart) has been formed on the top surface 6 thereof. The first step in the process was to deposit a blanket metal film (not shown) which was then patterned by forming a photoresist mask (not shown) and etching to form a set of metal capture pads 11 in a layout that is compatible in its configuration with the configuration (shown in FIGS. 1 and 2I) of the micro-BGA balls 24.

FIG. 4C shows the SBP 208 of FIG. 4B after formation a standard silicon BEOL structure 12 comprising a multilevel dielectric and interconnection structure formed over the top surface 6 of silicon wafer 10 covering the metal capture pads 11 and covering exposed portions of the top surface of silicon wafer 10. The BEOL structure 12 is of the kind well known to those skilled in the art which provides electrical signal and power line interconnections (not shown for convenience of illustration) within the type of packaging structure shown in FIG. 1 to connect to the C4's 42 of chips 44 and any other devices supported on the packaging structure, as well as the metal capture pads 11.

Referring again to FIG. 4C, an array of C4 landing pads 13, which are formed above the standard silicon multi-level BEOL structure 12, connect to wiring in the BEOL structure 12. The C4 landing pads 13 can be used to perform an electrical test for opens/shorts of all chip-to-chip nets (wiring).

Then, as shown in FIG. 4C, after the electrical testing step, the C4 landing pads 13 and the BEOL structure 12 are coated, with a thin overcoat 14, preferably composed of polyimide to protect the structure during intermediate process steps.

FIG. 4D shows the SBP 208 of FIG. 4C, which has been inverted, after joining the interconnection structure 12 (above the "top" surface 6 of the silicon wafer 10) to a temporary, transparent, glass wafer holder 16, using a thin film 15 of a releasable adhesive such as polyimide. The SBP 208 and the temporary, transparent, glass wafer holder 16 were then inverted, after joining the SBP 208 to the temporary, transparent, glass wafer holder 16. The provision of the temporary, transparent, glass wafer holder 16 permits the normal handling of the SBP 208 instead of the extraordinary techniques that would be required if an ultra-thin wafer (in place of silicon wafer 10) were to be handled without the mechanical support of a temporary, transparent, glass wafer holder 16.

FIG. 4E shows the SBP 208 of FIG. 4D after the silicon wafer 10 has been thinned to form a UTSW 100 with a substantially planar, thinned reverse surface 27 on the top of the SBP 208. The thinned reverse surface 27 of the silicon wafer 10 is formed by use of a subtractive process to remove material from the reverse surface 7 of the silicon wafer 10 until the silicon wafer 10 has reached the appropriate or desired thickness. Preferably, the silicon wafer 10 is thinned by a combination of processing by Back Side Grinding (BSG) and Chemical Mechanical Planarization (CMP). Alternatively a thinning technique for a silicon wafer 10 is plasma processing or the like, as will be understood by those skilled in the art.

As shown in FIG. 4E, the UTSW 100 has a thickness of about 25-100 μm from the "top" surface 6 to the thinned reverse surface 27. The thickness of the silicon wafer 100 is reduced from the thickness of silicon wafer 10 which would conventionally be about 750 μm. Because the silicon wafer 10 was joined to the temporary, transparent, glass wafer holder 16 (FIG. 4D) before thinning, it has become unnecessary to handle the UTSW 100/BEOL structure 12 with the C4 landing pads 13, etc. as a separate structure. Thus, the probability of damaging the thin UTSW 100 is minimized because of the structural support provided by the temporary, transparent, glass wafer holder 16.

FIG. 4F shows the SBP 208 of FIG. 4E after the thinned reverse "bottom" surface 27 of the UTSW 100 has been covered with a blanket hard mask layer 400 in the form of a thin film layer. The hard mask layer 400 is formed above the inverted, thinned reverse surface 27 of the UTSW 100.

In the next step, a temporary photoresist mask 18 is formed above the hard mask layer 400 for patterning thereof in preparation for forming Vertical Sidewall Through Vias (VSTV) holes 518 as shown in FIG. 4I. Then temporary photoresist mask 18 is patterned with an array of open via windows 18' therethrough, which reach down to the surface of the hard mask 400. This exposure step requires a lithography tool capable of viewing and aligning to one side of a wafer while exposing through a photomask on the reverse side, such as a KarlSuss MA8. The hard mask layer 400 may be composed of any hard masking material, as will be well understood by those skilled in the art. A suitable material(s) for the hard mask layer 400 may comprise a material(s) selected from the group consisting of silicon dioxide, silicon nitride, FSG (Fluorinated Silicate Glass, also known as FluoroSilicate Glass and Fluorine-doped Silicon Glass), and the like.

In the next step, a temporary photoresist mask 18 is formed above the hard mask layer 400 for patterning thereof in preparation for forming VSTVs 417' as shown in FIG. 4I. Then the temporary mask 18 is patterned with an array of open via windows 18' therethrough, which reach down to the surface of the hard mask 400. This exposure step requires a lithography tool capable of viewing and aligning to one side of a wafer while exposing through a photomask on the reverse side, such as a KarlSuss MA8. The hard mask layer 400 may be composed of any hard masking material as will be well understood by those skilled in the art. As stated above, a suitable material(s) for the hard mask layer 400 may be selected from the group consisting of a thin film dielectric layer composed of a material(s) selected from the group consisting of silicon dioxide, silicon nitride, FSG, and the like.

FIG. 4G shows the SBP 208 of FIG. 4F after via openings 418, i.e. through holes, have been etched through the hard mask layer 400 below the open via windows 18' in the temporary photoresist mask 18. The result of this etching step is the formation of a patterned hard mask 400 with via openings 418 therethrough below the open via windows 18' in photoresist mask 18. The holes through the hard mask 400 are etched by conventional dry plasma etch processing steps, as will be well understood by those skilled in the art.

FIG. 4H shows the SBP 208 of FIG. 4G after stripping away the temporary photoresist mask 18 leaving the patterned hard mask 400 with via openings 418 therethrough ready for use to form the VSTV holes 518 seen in FIG. 4I by etching away portions of the silicon of the UTSW 100 below via openings 418.

Skipping for a moment to discuss what is shown in FIG. 4L, it is noted here, that by thinning the silicon wafer 10 to form the UTSW 100, a reasonable diameter conventional BLM pad 422 in VSTV hole 518 can be created with conventional etching techniques without excessively weakening the UTSW 100. While it would seem that making a wafer 10 thinner would make it weaker, in fact without thinning, a very large diameter via would be needed requiring a larger plug, thus making the structure weaker because of Thermal Coefficient of Expansion (TCE) forces exerted by such a large plug which would expand more than a smaller plug.

The point here is that with a UTSW 100 with thickness of the order of 75 μm, one can create the VSTV holes 518 shown in FIG. 4I with a dry etching process. Such a process typically will provide VSTV holes 518 with a 90 degree wall angle. Thus with a via pitch of 400 μm for the micro-BGA via pads 22, the top and bottom via diameters will be 150 μm and 150 μm respectively for a 75 μm thick Si wafer. Without the support of the glass wafer holder 16, one might require wafers with thicknesses in the range of 200 μm or more to allow handling during the many process steps required to build the BEOL structure. The top diameter of the via opening 418' using the dry-etch technique described above will be 150 μm for a via bottom diameter of 150 μm.

Alternately, much more expensive vertical-wall via formation and metal filling techniques will be required for wafers with thicknesses exceeding 150 μm. This is the key advantage of employing the UTSW coupled with a transparent glass wafer holder during BEOL processing.

The VSTV approach has several advantages as follows:
1) It allows for tighter via pitch and smaller via size than for the TSTV approach.
2) No resist is used for opening the dielectric in the via with a VSTV structure. This is a big problem with the TSTV approach.
3) Simple processes for filling a 1:1 aspect via with conductor are straightforward. Higher aspect ratio via filling is more difficult. As it is desirable to have a 50 μm diameter via, the wafer thinning has been targeted for 50 μm as well.
4) CTE (Coefficient of Thermal Expansion) mismatch stresses are a function of via conductor material and aspect ratio enhancing reliability of the described structure.

FIG. 4I shows the SBP 208 of FIG. 4H after etching a plurality of VSTV holes 518 through the UTSW 100 using the access provided through the open windows 418 through the hard mask 400 using a dry etching process, such as high selectivity silicon RIE. The result is that the surfaces of the metal capture pads 11 are exposed at the bottom of the VSTV holes 518.

The plurality of VSTV holes 518 are formed by etching through the thickness (e.g. 25 μm-100 μm) of the UTSW 100 (with a dry etching process) to expose surface areas of the top surfaces of the metal capture pads 11 that are located below the hard mask via windows 418 in alignment therewith. Among other purposes, the metal capture pads 11 serve as etch stops for dry etching the process used to form the VSTV holes 518 through the UTSW 100, as will be well understood by those skilled in the art. Thus each VSTV hole 518 is both centered over a metal capture pad 11 and reaches through the UTSW 100.

FIG. 4J shows the SBP 208 of FIG. 4I after deposition of a blanket dielectric isolation layer 420 composed of a dielectric material, preferably a conformal layer of CVD silicon oxide, that passivates the upwardly facing "bottom" surface of the UTSW 100, as well as the sidewalls of the VSTV holes 518, that have been lined by the isolation layer 420 to form narrower VSTV holes 518'. The tops of the metal capture pads 11 are now covered by the blanket dielectric isolation layer 420.

FIG. 4K shows the SBP 208 of FIG. 4K after selective removal of the horizontal portions of the conformal isolation layer 420 from the surface of the hard mask 400 at the base of all of the VSTV holes 518', exposing the conductor regions of metal capture pad 11. This is easily accomplished using a directional oxide RIE. The result shown in FIG. 4K is that the isolation layer 420, which remains on the sidewalls of the narrowed VTSV holes 518', has been removed from the bottom of the narrowed VSTV holes 518' and from the top surface of the hard mask 400. Moreover, the isolation layer 420 covers all exposed surfaces of the silicon of the UTSW 100 in the via holes 518', while at the same time, at least substantial portions of the surface of the metal capture pads 11 are exposed.

FIG. 4L shows the SBP 208 of FIG. 4K after formation in each of the narrowed VSTV holes 518' of a corresponding conventional BLM pad 422 with vertical sidewalls over the dielectric isolation layer 420 and covering the exposed surfaces of the metal capture pads 11. Formation of the BLM pads 422 is accomplished by depositing and patterning BLM metallurgy for a micro-BGA, as will be well understood by those skilled in the art. Each BLM pad 422 extends through the narrowed VSTV holes 518' in the UTSW 100 and into mechanical and electrical contact with the exposed surface of a corresponding metal capture pad 11 and reaches over the dielectric isolation layer 420 covering the vertical sidewalls of the VSTV holes 518' (forming a set of narrower VSTV holes 518") and extends around the periphery of the narrower VSTV holes 518". The BLM pads 422 provide contact landing pads for micro-BGA balls 424 seen in FIG. 4M.

FIG. 4M shows the SBP 208 of FIG. 4L, which has been completed by the formation of an array of micro-BGA balls 424 comprising a set of solder ball connectors that are bonded to the BLM pads 422 and that are thereby inter-connected to the array of metal capture pads 11. The micro-BGA balls 424 are ready to be connected to the package carrier 30 shown in FIGS. 1 and 4N. Thus, the micro-BGA balls 424 make contact with the metal capture pads 11 through the BLM pads 422 which extend through the thickness of the UTSW 100.

At this point, if required, the SBP 208 structure is diced to form individual wiring structures from the plurality of structures formed on the temporary, trans-parent, glass, wafer holder 16, as will be well understood by those skilled in the art.

FIG. 4N shows a MLC carrier 30 that has been built starting with a ceramic carrier body 32. There is a set of conductive carrier vias 36 (a few of which are shown, for purposes of illustration) extending through the carrier body 32 from the top to the bottom thereof.

The carrier vias 36 extend between a set of conductive BGA pads 38 comprising a portion of the TSM formed on the top surface of the carrier body 32 and a corresponding set of bottom pads 34 (comprising a portion of the BSM formed on the lower surface of the carrier body 32). Preferably substantial spacing separates the conductive carrier vias 36 in the ceramic carrier body 32.

FIG. 4O shows a combined package 40' comprising the SBP 208 of FIG. 4M which has been reinverted with the temporary, transparent, glass wafer holder 16 on the top and the micro-BGAs 24 on the bottom with the micro-BGAs 424 bonded to the BGA pads 38 on the top of the ceramic carrier 30 of FIG. 4N.

FIG. 4P shows the combined package 40 of FIG. 4O from which the temporary, transparent, glass wafer holder 16 has been released and removed from the surface of the SBP 208 by releasing the releasable adhesive, thin film 15. If the thin film 15 comprises polyimide, the releasing step can be performed by laser ablation of the polyimide layer with laser radiation through the transparent, temporary, glass wafer holder 16. The step of laser ablation is employed to remove only a few Angstroms of material, which is sufficient to achieve the release of the transparent, temporary, glass wafer holder 16.

Next, the thin overcoat 14 (e.g. polyimide film 14) is patterned to form openings in the overcoat 14 to expose the top surfaces of the C4 landing pads 13.

FIG. 4Q shows the combined package 40 of FIG. 4Q after chips 44 with C4 solder balls or solder micro-bumps 42 have been joined to the SBP 208 by bonding by the array of C4 solder balls 42 to the array of C4 landing pads 13. After the chips 44 are joined to the SBP 208, the combined package 40 is tested. If needed, a set of BGAs balls 48 of a BGA array are formed and bonded to the BGA pads 34.

Figure 5C:
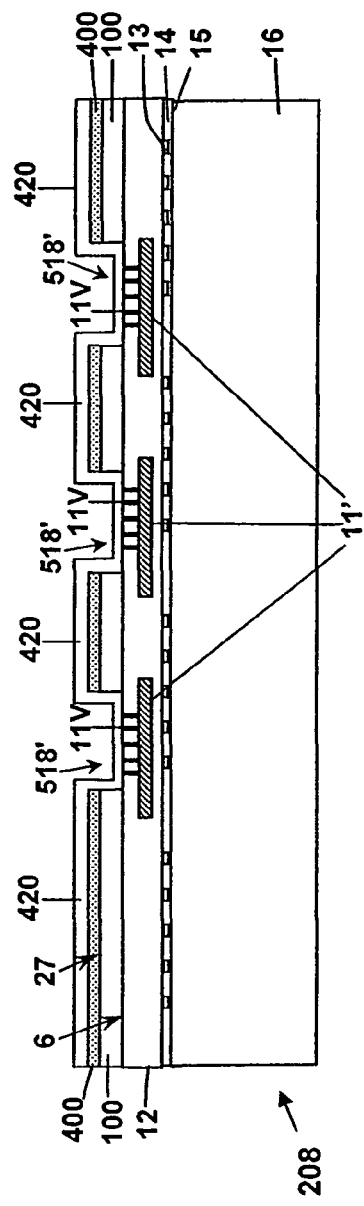
Figure 5D:
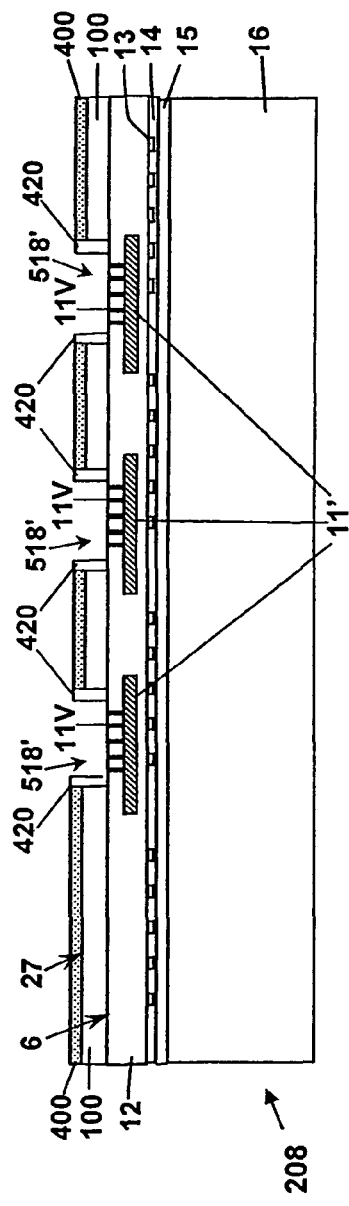

Process Flow 4—Silicon Based Packaging with through Vias with Vertical Sidewalls, Buried Metal Capture Structure with Metal Capture Pads and Metal Capture Vias FIGS. 5A-5E are schematic sectional diagrams of the process flow for forming an SBP with VSTV structures and metal capture structures in the form of buried metal capture pads 11' below the VSTV holes 518 in FIG. 5B and VSTV holes 518' in FIGS. 5C and 5D. The metal capture structures include an array (set) of metal capture vias 11V, with small diameters. The metal capture vias 11V reach from the VSTV holes down to the buried metal capture pads 11' in accordance with the sequence of steps of a modification of the third process flow.

While the current preferred embodiment uses a dual damascene line/via 11 as shown in the shown in FIGS. 4A-4Q, another significant discovery pertains to the fact that the structure and/or location of the metal capture pads 11 can be modified as shown in FIGS. 5A-5E.

In the embodiment shown in FIGS. 5A-5E, the metal capture pads 11' are buried in the BEOL dielectric layer 12 and a set of thin, i.e. small diameter, metal capture vias 11V reach down through the intervening portion of the BEOL dielectric layer 12 to provide electrical and mechanical contact with the buried metal capture pads 11'. FIG. 5A shows that in this embodiment of the invention the metal capture pads 11' are not formed directly on the first surface of the wafer 10 or the UTSW 100. To accommodate that variation in the structure of the SBP 208, the metal capture vias 11V, that extend through the BEOL dielectric layer 12 have been added. The metal capture vias 11V reach up to the first surface of silicon layer 100 to provide for contact to the BLM metallization 422 in FIG. 5E instead of the direct mechanical and electrical contact between the BLM metallization and metal capture pads 11 in FIG. 4L. As the dry etching through the backside of the thin wafer 100 progresses, the etching stops at the silicon/via/dielectric interface because of very good selectivity to the dielectric. In fact the set of thin, small diameter, metal capture vias 11V can extend completely through the BEOL dielectric layer 12.

Thus the metal capture pad 11' of FIGS. 5A-5E is buried and the metal capture pad 11 of FIGS. 4H-4L is replaced on the surface at the bottom of the VSTV hole 518 by a group of metal capture vias 11V or perhaps even a single metal capture via 11V reaching up from the buried metal capture pads 11'. Since formation of through metal capture vias 11V using dry etching does not suffer from the very large bias of the wet etch process, much smaller through via sizes and pitches can be achieved.

FIG. 5A shows an SBP 208 with the buried capture pads 11' and the metal capture vias 11V. The SBP 208 is shown with a hard mask layer 400 formed on the thinned reverse surface 27 of the UTSW. The hard mask 400 is shown after stripping away a temporary photoresist mask (such as mask 18 in FIG. 4G) which was used to form openings 418 through hard mask 400 so that it is ready for use to form the VSTV holes 518 seen in FIG. 5B, by etching away portions of the silicon of the UTSW 100 where the thinned reverse surface 27 is exposed below the via openings 418.

In this embodiment in the processing between FIGS. 4A and 4C, the BEOL structure 12 (including multilayer conductor patterns and C4 pads) is formed over the top wafer surface 6 including the C4 pads 13 by process steps needed to form the buried capture pads 11' and the capture vias 11V. In the case of the buried metal capture pad 11', a multi-step process is used starting with formation of a portion of the BEOL structure 12 followed by forming narrow diameter via holes which are filled with small diameter, metal capture vias 11V. Then the buried metal capture pad 11' is formed followed by completion of the remainder of the BEOL structure.

FIG. 5B shows the SBP 208 of FIG. 5A after etching a plurality of VSTV holes 518 through the UTSW 100 using the access provided through the open windows 418 through the hard mask 400 using a dry etching process, such as a high selectivity silicon RIE process, thereby exposing the top surfaces of the metal capture vias 11V.

FIG. 5C shows the SBP 208 of FIG. 5B after deposition of a blanket dielectric isolation layer 420 composed of a dielectric material, preferably a conformal layer of CVD silicon oxide, which passivates the upwardly facing "bottom" surface of the UTSW 100, as well as the sidewalls of the VSTV holes 518, which have been narrowed to form narrowed VSTV holes 518'. The tops of the set of metal capture vias 11V are now covered by the blanket dielectric isolation layer 420.

FIG. 5D shows the SBP 208 of FIG. 5C after selective removal of the horizontal portions of silicon oxide isolation layer 420 from the surface of the hard mask 400 at the base of all of the VSTV holes 518', exposing the top surfaces of the metal capture vias 11V. This is easily accomplished using a directional oxide RIE. The result shown in FIG. 5D is that the silicon oxide isolation layer 420 has been removed from the bottom of the narrowed VSTV holes 518' which is formed on the sidewalls of the narrowed VTSV holes 518', and on the top surface of the hard mask 400 covers all exposed surfaces of the silicon of the UTSW 100 in the via holes 518', while at the same time, at least substantial portions of the surface of the metal capture vias 11V are exposed.

Figure 5E:
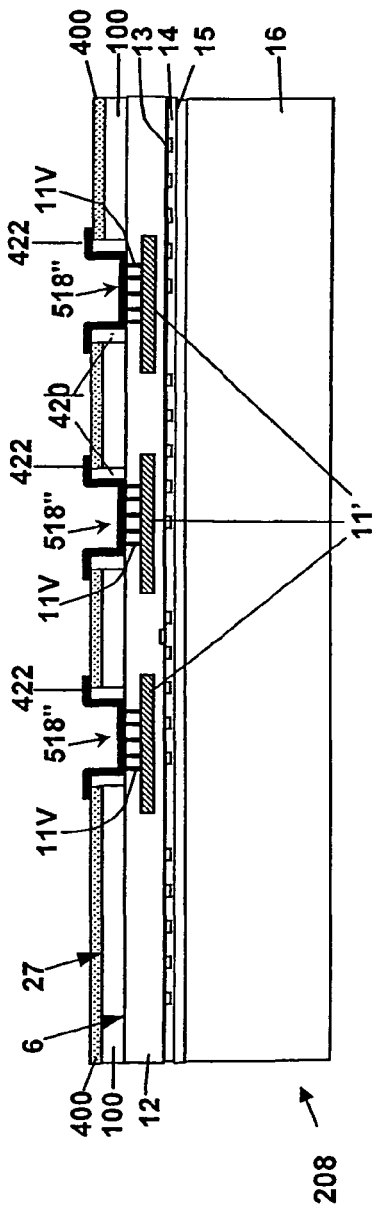

FIG. 5E shows the SBP 208 of FIG. 5D after formation in each of the plurality of narrowed VSTV holes 518' of a conventional BLM pad 422 with vertical sidewalls over the dielectric isolation layer 420 and covering the exposed surfaces of the metal capture vias 11V. The BLM pads 422 are formed by depositing and patterning BLM metallurgy for a micro-BGA (Ball Grid Array), as will be well understood by those skilled in the art. Each BLM pad 422 extends through the UTSW 100 and into contact with the exposed surface of the corresponding metal capture via 11V (and thereby into contact with the buried capture via 11') and reaches over the dielectric isolation layer 420 covering the vertical sidewalls of the VSTV holes 518' (forming a set of narrower VSTV holes 518") and extends around the periphery of the narrower VSTV holes 518". The BLM pads 422 provide a set of contact landing pads for a set of micro-BGA balls 424, as seen in FIG. 4M.

The remainder of the process steps and the structure of the embodiment of FIGS. 5A-5E are identical to the teachings of FIGS. 4M-4Q and the related description thereof since those drawings and description relate to the devices produced above the BLM pads 422.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A silicon based package (SBP) comprising: an ultra thin silicon wafer (UTSW) composed of silicon and having a first surface of silicon and a reverse surface; metal capture structures each having a first surface formed directly on the first surface of silicon of the UTSW and an exposed surface; an interconnection structure formed over the first surface of the UTSW and the exposed surface of the metal capture structures; vertical sidewall through via (VSTV) holes formed in the SBP with hole sidewalls that extend from the reverse surface through the UTSW to the first surface of the metal capture structures; a layer of dielectric material covering at least the sidewalls of the VSTV holes leaving at least a portion of the first surface of the metal capture structures exposed; and ball limiting metallurgy (BLM) comprising a layer of metal covering the exposed portion of the metal capture structures and the layer of dielectric material on the sidewalls of the VSTV holes to form metal lined sidewalls in the VSTV holes which metal lined sidewalls extend through the UTSW into contact with the layer of metal covering the exposed portion of the metal capture structures to form a metal lined recessed via pad structure in the UTSW extending to the metal capture structures to allow solder ball contact with the metal lined sidewalls and the layer of metal covering the exposed portion of the metal capture structures.

2. The silicon based package of claim 1 further including a solder ball formed in the metal lined recessed via pad structure in contact with the metal capture structures.

3. A silicon based package (SBP) comprising: an ultra thin silicon wafer (UTSW) composed of silicon having a first surface of silicon and a reverse surface and a thickness of about 50-75 μm; metal capture structures each having a first surface formed directly on the first surface of silicon of the UTSW and an exposed surface;

an interconnection structure formed over the first surface of the UTSW and the exposed surface of the metal capture structures; vertical sidewall through via (VSTV) holes formed in the SBP with hole sidewalls that extend from the reverse surface through the UTSW to the first surface of the metal capture structures with the wall angle of the VSTV holes tapered from the reverse surface to the first surface; a layer of dielectric material covering at least the sidewalls of the VSTV holes leaving at least a portion of the first surface of the metal capture structures exposed; and ball limiting metallurgy (BLM) comprising a layer of metal covering the exposed portion of the metal capture structures and the layer of dielectric material on the sidewalls of the VSTV holes to form metal lined sidewalls in the VSTV holes which metal lined sidewalls extend through the UTSW into contact with the layer of metal covering the exposed portion of metal capture structures to form a metal lined_recessed via pad structure in the UTSW extending to the metal capture structures to allow solder ball contact with the metal lined sidewalls and the layer of metal covering the exposed portion of the metal capture structures.

4. The silicon based package of claim 3 further including a solder ball formed in the metal lined recessed via pad structure in contact with the metal capture structures.

5. The silicon based package of claim 3 wherein the wall angle of the VSTV holes formed in the SBP are taped at about 45 degrees.

6. The silicon based package of claim 5 wherein the wall angle of the USTV holes have an opening at the reverse surface of 300 μm and an opening at the first surface of 150 μm.

7. The silicon based package of claim 3 wherein the wall angle of the VSTV holes formed in the SBP are substantially vertical.

* * * * *